United States Patent [19]

Tomofuji et al.

[11] Patent Number: 5,595,844
[45] Date of Patent: Jan. 21, 1997

[54] METHOD OF EXPOSING LIGHT IN A METHOD OF FABRICATING A RETICLE

[75] Inventors: Yoko Tomofuji; Makoto Nakase, both of Tokyo, Japan; Takashi Sato, Fishkill, N.Y.; Hiroaki Hazama, Yokohama, Japan; Haruki Komano, Yokohama, Japan; Shinichi Ito, Yokohama, Japan

[73] Assignee: Kabushiki Kaisha Toshiba, Kawasaki, Japan

[21] Appl. No.: 453,667

[22] Filed: May 30, 1995

Related U.S. Application Data

[60] Division of Ser. No. 192,091, Feb. 4, 1994, abandoned, which is a continuation-in-part of Ser. No. 798,721, Nov. 29, 1991.

[30] Foreign Application Priority Data

| Nov. 29, 1990 | [JP] | Japan | 331308 |
| Jul. 3, 1991 | [JP] | Japan | 163131 |
| Nov. 11, 1991 | [JP] | Japan | 294540 |
| Nov. 13, 1991 | [JP] | Japan | 297461 |

[51] Int. Cl.$^6$ .................................................. G03F 9/00
[52] U.S. Cl. .................................. 430/5; 430/30; 430/321; 356/361
[58] Field of Search .................................. 430/5, 30, 321; 356/361

[56] References Cited

U.S. PATENT DOCUMENTS

| 5,214,489 | 5/1993 | Mizutani et al. | 356/363 |
| 5,328,807 | 7/1994 | Tanaka et al. | 430/5 |
| 5,424,153 | 6/1995 | Asai | 430/5 |

FOREIGN PATENT DOCUMENTS

| 4-136854 | 5/1992 | Japan . |
| 5-127361 | 5/1993 | Japan . |

*Primary Examiner*—Mark Chapman
*Attorney, Agent, or Firm*—Finnegan, Henderson, Farabow, Garrett & Dunner, L.L.P.

[57] ABSTRACT

In a reticle, a semi-transparent film pattern in place of a light blocking film pattern is used as a mask pattern having a size within a certain range, whereby an exposure system can be improved in resolution limit and faithful pattern transfer can be realized with a constant light quantity. A reticle may be of a stacked layer structure which comprises a shift film for providing a different optical path to exposure light, a mask substrate formed on the top or bottom of the shift film, and a transmissivity ratio adjustment layer having a predetermined transmissivity ratio to the exposure light. The material of a phase shifter may be adjusted in amplitude transmissivity ratio so that a shifter width for effectively improving a contrast can be made large and an accuracy necessary for a shifter width can be loosened. The mask pattern may include a semi-transparent film pattern which is made of silicon, a silicon compound, a mixture containing silicon, germanium, a germanium compound or a mixture containing germanium to provide a different optical path from that of the transparent part with respect to lithographic light. A silicon compound, a mixture containing silicon, germanium, a germanium compound or a mixture containing germanium is controlled in its composition ratio to form a semi-transparent film pattern on a transparent substrate.

10 Claims, 30 Drawing Sheets

δ:SHIFTER WIDTH (μm)

D:PATTERN SIZE (μm)

δ:SHIFTER WIDTH

T:SHIFTER AMPLITUDE TRANSMISSIVITY

NA=0.42
λ=2.48nm
δ=0.5

IMAGE INTENSITY DISTRIBUTION OF LIGHT PASSED TROUGH L/S=0.3μm

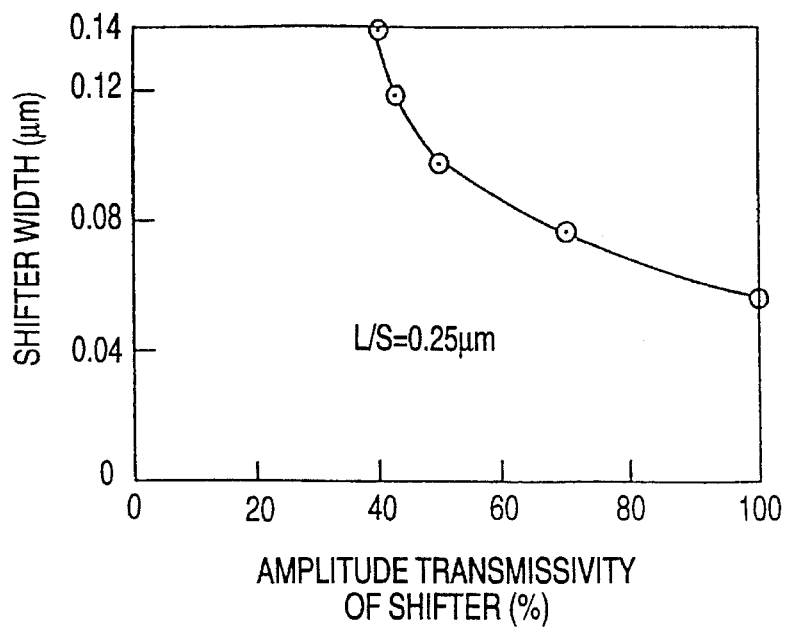
FIG. 19
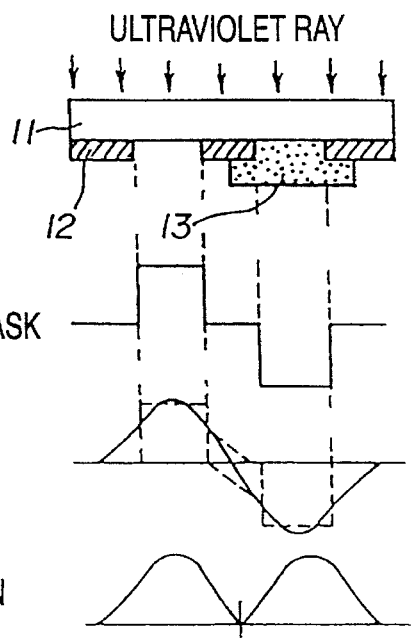
FIG. 20(a)
(PRIOR ART)
FIG. 20(b)
(PRIOR ART) AMPLITUDE DISTRIBUTION OF LIGHT PASSED TROUGH MASK
FIG. 20(c)
(PRIOR ART) AMPLITUDE DISTRIBUTION OF LIGHT ON WAFER
FIG. 20(d)
(PRIOR ART) INTENSITY DISTRIBUTION OF LIGHT ON WAFER

FIG. 21(a)
(PRIOR ART)
FIG. 21(b)
(PRIOR ART)
FIG. 21(c)
(PRIOR ART)
FIG. 21(d)
(PRIOR ART)
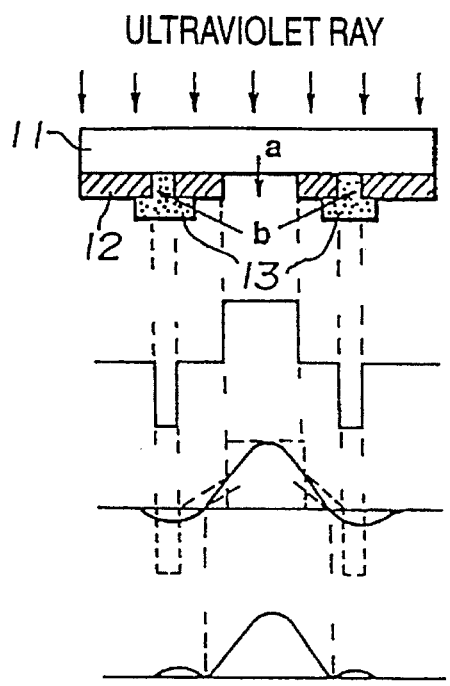
FIG. 22(a)
(PRIOR ART)
FIG. 22(b)
(PRIOR ART)
FIG. 22(c)
(PRIOR ART)
FIG. 22(d)
(PRIOR ART)
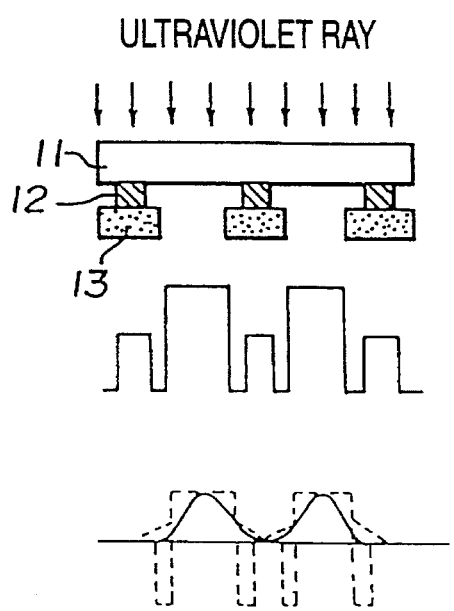

NA=0.42
λ=2.48nm
D=PATTERN SIZE

METHOD OF EXPOSING LIGHT IN A METHOD OF FABRICATING A RETICLE

This is a division of application Ser. No. 08/192,091, filed Feb. 4, 1994 now abandoned which is a continuation-in-part of application Ser. No. 07/798,721, filed Nov. 29, 1991 now abandoned.

BACKGROUND OF THE INVENTION

The present invention relates to a reticle and a method of fabricating a reticle.

The semiconductor integrated circuit has been steadily increase in their high integration and miniaturization properties. In the fabrication of the highly integrated semiconductor circuit, a lithography technique plays a vital role.

Most of the lithography techniques now employ a master pattern which is projected on an LSI substrate through a reducing optical system. In these techniques, however, when a high voltage mercury lamp is employed as a light source, the minimum linewidth is about 0.5 μm. For the purpose of obtaining a pattern size of less than 0.5 μm, there have been developed a direct writing technique using a KrF excimer laser or an electron beam, and an X-ray unity magnification lithography technique. However, from the viewpoint of mass productivity, process versatility and so on, great expectation has been directed to the photolithography technique.

Under such circumstance, various studies have been made in the photolithography technique. For a light source, g ray, i ray, X ray, excimer laser, etc. have been studied. For a resist, possibility of development of new resist materials and new resist processing such as REL have been studied. Further SREP.CEL image reverse technique has been studied.

With respect to the mask fabrication technique, sufficient studies had not been made until Levenson, et al. of IBM Corporation have proposed a phase shift method in 1982. Since then, attention has been directed to the phase shift method. In the phase shift method, the phase of a beam passing through a mask is controlled for the purpose of enhancing the resolution and contrast of a projected image.

The principle of this method will be explained by referring to FIG. 20(a)–(d). As shown in FIG. 20(a), a mask comprises a mask pattern 12 of laminated films made of chrome (Cr) or chrome oxide ($Cr_2O_3$) formed on a quartz substrate 11 by a sputtering or the like process, and a transparent film 13 formed on one of an adjacent pair of light transmissible areas in the mask pattern 12. The phase of light passing through the transparent film area is inverted as shown in FIG. 20(b) and light passed through the adjacent transmissible areas are canceled each other at the boundary part between the two transmissible areas as shown in FIG. 20(c). As a result, light intensity at the boundary part between the two light transmissible areas becomes zero and thus the two light transmissible areas can be formed in separate patterns on the wafer as shown in FIG. 20(d). In this method, a pattern of 0.7 μm can be resolved by using a g-ray stepper having a numerical aperture (NA) of 0.28, thus improving the resolution by about 40%. In this method, in order to inverse the phase of the light passing through the transparent film 13, the transparent film 13 as a phase shifter must satisfy a relationship of $d=\lambda/2(n-1)$, where 'd' denotes the thickness of the film, 'n' denotes the refractive index of the material of the phase shifter, and 'λ' denotes the wavelength of light to be radiated.

Terazawa et al. of Hitachi Ltd. have further developed the method based on Levenson et al. and proposed a new technique in which the Levenson technique is applied to an isolated pattern, which principle is shown in FIG. 21(a)–(d). In the Terazawa technique, an isolated pattern 'a' and an auxiliary pattern 'b' as a dummy which is not resolved by itself are provided, and phase shifters 13 for inverting the light passing therethrough are provided to the patterns. In this technique, an isolated space of 0.3 μ and a contact hole having a diameter of 0.4 μ are resolved in an i-ray stepper, having a numerical aperture (NA) of 0.42. Thus, the resolution is improved by about 30% compared with that of the prior art technique. However, with respect to the contact hole, as the pattern sizes become smaller, the difference in light intensity between the isolated and auxiliary patterns becomes smaller. Thus, this technique has resolution limit because the intensity of light passing through the transparent areas is weakened as the pattern size becomes smaller.

The aforementioned prior art technique has additional problems that, since the phase shifter is located for every other light transmissible area in a line-and-space pattern while a mask layer for the auxiliary pattern is processed such that the phase shifter is provided for the isolated pattern, the position alignment of the shifters to the mask pattern and a selective processing technique become necessary and the number of necessary steps will be greatly increased and thus the mask fabrication steps becomes complicated.

In view of such problems, Nitayama, et al. of Toshiba Corporation have suggested a phase shift mask structure in which a phase shifter is provided at the periphery of a light transmissible area or a light blocking area. The principle of this structure is shown in FIG. 22(a)–(b). As shown in FIG. 22(a), a mask comprises a mask pattern 12 of chrome (Cr) and chrome oxide ($Cr_2O_3$) formed on a quartz substrate 11, and a transparent film of a phase shifter 13 formed as protruded from the periphery of the mask pattern 12. When such a mask is used, the phases of lights passing through the shifters are inverted so that the amplitudes of the lights with phases 0 degree and 100 degree cancel each other at both ends of the light transmissible area as shown in FIG. 22(b). Thus, the light intensity becomes small and the contrast is improved as shown in FIG. 22(c). As a result, the light intensities at the both ends of the light transmissible area become substantially zero and thus the two light transmissible areas can separate the pattern formed on the wafer as shown in FIG. 22(d).

The above mask is formed in the following manner. First, as shown in FIG. 23(a), a laminated film 12 of about 100 nm of chrome (Cr) and chrome oxide ($Cr_2O_3$) is deposited on the quartz substrate 11 by sputtering or like processes. A resist coated on the film 12 is subjected to electron beam writing operation, and then developed so as to form a resist pattern R.

Next, as shown in FIG. 23(b), the resultant substrate is subjected to an etching operation by wet etching or by reactive ion etching process with use of the resist pattern as a mask to remove the resist pattern R and form the mask layer 12. Thereafter, as shown in FIG. 23(c), the resultant substrate is coated with a PMMA film, and is exposed with light from the back face to form a latent image 13S. Then the resultant substrate is subjected to a developing operation to form phase shifters 13 of a PMMA film pattern as shown in FIG. 23(d). Finally, as shown in FIG. 23(e), the mask layer 12 is subjected to a side etching with use of the phase shifters 13 of the PMMA film pattern as a mask, whereby such a mask that the phase shifter 13 is protruded from the associated mask layer 12 is fabricated.

In this mask, the PMMA acts as the phase shifter. Since it has a high transmissivity ratio and a sharp resist profile, the PMMA is an excellent phase shifter. According to this method, the pattern of the phase shifter can be formed on a self alignment basis. Therefore, the mask alignment and selective processing steps are not required and thus a mask can be formed relatively easily.

With the mask, the phase of the light passed through the respective shifters is inverted as shown by a broken line in FIG. 22(c), the light intensity behind the mask layer is remarkably reduced so that intensity distribution of the whole light is as shown by a solid line in FIG. 22(d). This mask has a resolution as fine as nearly half that of the conventional mask.

Assuming that the transmissivity ratio of the phase shifter in the mask is 100%, the width of the shifter is optimized. It is found that the optimum shift width causing the greatest contrast of image varies depending on the pattern size. For example, as shown in FIG. 24, when an excimer stepper having a numerical aperture NA of 0.42 is employed, the optimum shift width is 0.04 μm (on the wafer) with respect to 0.3 μm of line-and-space pattern while the optimum shift width is 0.06 μm (on the wafer) with respect to 0.25 μm of line-and-space pattern. In this manner, the optimum shift which realizes the maximum contrast is determined according to the pattern size. The mask having the optimum shift width enables to resolve a fine pattern that can not be resolved in the conventional technique.

However, in fabricating the above mask, it is necessary to provide a fine shifter pattern on the fine pattern, which requires a very difficult work of controlling the shifter width.

Further, the shifter must be made of either a light transmissible film or a light blocking film. Generally, a mask used in the VLSI fabrication must be frequently cleaned because the mask must be used completely free of dust. For this reason, the phase shift mask must be strong enough to withstand the repetitive cleaning. The shifter formed with resist, however, is not strong enough to withstand the frequent cleaning.

As described above, reticles used in the conventional phase shift technique is defective in that it is very difficult to provide the fine shifter pattern on the fine pattern while controlling the shifter width and making alignment. In addition, the mask is not strong enough to withstand the VLSI fabrication processes.

Further, in order to make the most of the effect of the phase shifting, it is important to optimize a phase difference between light passed through the transparent film and light passed through a light semi-transparent film as well as an amplitude transmissivity ratio therebetween. The phase difference and the amplitude transmissivity ratio are uniquely determined by the optical constant (complex refractive index n-ik, where i is unit imaginary number) of these films. In other words, in order to obtain a desired phase difference and a desired amplitude transmissivity ratio, a certain relationship must be satisfied between the optical constant and the film thickness. However, because the optical constant is inherent in the substance, it is difficult to satisfy the desired relationship with use of a single layer film.

FIG. 30 shows a structure of a conventional ideal half-tone phase film. A mask formed according to the conventional method comprises a light transmissible film 301 and a semi-transparent film. The semi-transparent film is formed to have an amplitude transmissivity ratio of 10 to 40% with respect to the light transmissible film and to change the phase of light passing through the semi-transparent film by 180 degrees with respect to the light transmissible film. For the purpose of satisfying these conditions, the semi-transparent film has a two-layer structure which comprises a first layer 302 for adjusting the amplitude transmissivity ratio and a second layer 303 for adjusting the total phase difference of the first and second layers 302 and 303 to be 180 degrees.

In the conventional half-tone phase shift method, the half-tone film has a two-layer structure comprising the first layer for adjusting the amplitude transmissivity ratio and the second layers for adjusting the total phase difference generated through the first and second layers to be 180 degrees. However, the two-layer structure is difficult to fabricate, since it requires pattern transfer and the first and second layers must be processed in the same sizes.

Especially, it is extremely difficult to cure a defect when the lower layer 302 becomes defective as shown in FIG. 31.

SUMMARY OF THE INVENTION

In view of the above circumstances, it is an object of the present invention to provide a reticle capable of improving the resolution limit of an exposure system and can realize faithful pattern transfer with a constant light quantity, and a method for fabricating the reticle.

Another object of the present invention is to provide a reticle capable of satisfying conditions of amplitude transmissivity ratio and phase difference with use of a single layer film which can exhibit its maximum phase shift effect.

In a reticle in accordance with a first embodiment of the present invention, a semi-transparent film pattern is employed in place of a light blocking film pattern for A mask pattern having a size within a certain range. Preferably, the amplitude transmissivity ratio of the semi-transparent film pattern is adjusted according to the size of the mask pattern.

Further, the semi-transparent film pattern preferably comprises a plurality of divided fine regions which are not resolved with lithographic light and have different amplitude transmissivity ratios.

Preferably, the semi-transparent film pattern is formed so that the amplitude transmissivity ratio of the film pattern is adjusted according to the occupied area ratio of the fine regions.

Further, the semi-transparent film pattern is preferably formed to include a region whose amplitude transmissivity ratio is changed by the ion implantation.

A reticle in accordance with a second embodiment of the present invention has a laminated layer structure which comprises a phase shift film for changing an optical path, a mask substrate formed on the top or bottom of the phase shift film, and a semi-transparent film having a predetermined transmissivity ratio serving as a transmissivity ratio adjustment layer.

In accordance with a third embodiment of the present invention, the amplitude transmissivity ratio of the material of a phase shifter is adjusted so that a shifter width which affects the contrast can be increased and the accuracy for a shifter width can be loosened. That is, when a value of a pattern size of the mask pattern divided by a light exposure condition λ/NA is in a range between 0.34 and 0.68, the amplitude transmissivity ratio of the phase shifter is set to be less than 100% and a shifter width is set to be as large as possible to such an extent that the shifter width does not affect the adjacent pattern. Preferably, the shifter width is set to be sufficiently large and the amplitude transmissivity ratio of the phase shifter is selected to provide its maximum contrast according to the pattern size.

By using simulation, the distribution of the image intensity projected on the wafer is estimated with respect to the transmissivity ratio of the phase shifter. As a result, it has been found that, when a semi-transparent film pattern having a predetermined transmissivity ratio is used in place of a light blocking film pattern, the contrast can be improved.

According to the simulation result, the present invention has been made. With the arrangement as described above, the resolution to a fine pattern image is improved. Further, since this arrangement enables the simultaneous patterning of the phase shifter and the light blocking film, the control for the patterning is easy to perform.

Preferably, the amplitude transmissivity ratio of the semi-transparent film pattern is adjusted according to the size of the mask pattern. Thus, the resolution can be further improved.

Further, by arranging a plurality of semi-transparent films having different transmissivity ratios in a pattern having a resolution below that of the lithographic optical system and by determined the occupied area ratio of these semi-transparent films to be the optimum amplitude transmissivity ratio according to the pattern size, a pattern having an amplitude transmissivity ratio according to the size of the pattern can be easily formed.

As described above, the reticle in accordance with the second embodiment of the present invention has a laminated layer structure which comprises a phase shift film for providing a different optical path to exposure light and a transmissivity ratio adjustment layer formed on the top or bottom of the phase shift film and having a predetermined transmissivity ratio to the exposure light. With this construction of the reticle, the phase shift film and the transmissivity ratio adjusting film can be selected independently of each other and also can be easily formed. In addition, the phase shift film may be made of a silicon di-oxide film, a spin-on glass film or any materials suitably selected from materials other than resins, and therefore a pattern having a strength enough to withstand repetitive cleaning which take place during the fabrication of VLSI.

Generally, an optical image depends on NA (numeral aperture of the optical system) and a wavelength $\lambda$. When a pattern size 'w' is standardized as satisfying the relationship:

$$y=w/(\lambda/NA),$$

the optical image having the same standard size $\gamma$ becomes completely analogous with analogous ratio $\lambda/NA$. A factor $NA/\lambda$ represents a cut-off frequency in a spatial frequency region and its reciprocal $\lambda/NA$ corresponds to frequency for one division when the cut-off frequency is considered "1" and is divided by $NA/\lambda$. In this manner, by dividing each pattern size by $\lambda/NA$, the position of the size in the spatial frequency region can be standardized.

As a result of various experiments conducted with use of the standard size, it has been found that this is effective, in particular, for mask patterns having standard size (which are the values divided by $\lambda/NA$ on the light exposure condition) of 0.61 or less. Accordingly, by forming a mask pattern with a semi-transparent film having a transmissivity ratio of 0–50% and providing a phase shift of 180 degrees for only the mask pattern having standard size of 0.61 or less, a desirable phase shift effect can be obtained and a pattern, which is impossible to resolve in conventional masks, can be resolved. With respect to the transmissivity ratio of the semi-transparent film, it is selected according to the pattern size so that the contrast become optimum.

For the purpose of obtaining the optimum relationship between amplitude transmissivity ratio and shifter width in an equi-spaced line-and-space pattern, the inventors of the present application have conducted simulation researches with use of a program for obtaining light image intensity distributions. As a result of the simulation, it has been found that the amplitude transmissivity ratio of the phase shifter causing the maximum contrast varies depending on the shifter width, and the optimum shifter width is increased as the amplitude transmissivity ratio decreases. Also, it has been found that this phenomenon takes place commonly when the value of the pattern size of the mask pattern divided by $\lambda/NA$ on the light exposure condition is in a range of from 0.34 to 0.68. Accordingly, by appropriately adjusting the transmissivity ratio of the phase shifter for each pattern size within this range, contrast can be greatly improved effect with the shifter width in a range allowing sufficient accuracy in phase shifting processing. Further, by determining the shifter width to be sufficiently large and by selecting the amplitude transmissivity ratio of the phase shifter such that the contrast becomes maximum according to the pattern size, the mask can be fabricated relatively easily.

A reticle in accordance with a fourth embodiment of the present invention includes, as a mask pattern, a semi-transparent film pattern which is made of silicon, a silicon compound or a mixture including silicon or made of germanium, a germanium compound or a mixture including germanium and which optical path is different from a transparent part by a predetermined amount with respect to lithographic light.

Preferably, the semi-transparent film pattern desirably includes an ion implanted region. Further, the semi-transparent film pattern contains a region which has a crystalline state changed through heat treatment.

In accordance with a fifth embodiment of the present invention, there is formed on a transparent substrate a semi-transparent film pattern which is made of silicon, a silicon compound or a mixture including silicon or made of germanium, a germanium compound or a mixture including germanium and which has a controlled composition ratio.

Preferably, silicon is used as a target, a predetermined amount of nitrogen gas is added in a sputtering atmosphere and a nitrogen composition ratio is controlled to form a nitrogen silicon film and thus a semi-transparent film pattern while adjusting an amplitude transmissivity ratio.

Further, a silicon di-oxide film is preferably deposited by a CVD method while adjusting the amount of oxygen in a raw material gas to control an oxygen composition ratio, to adjust an amplitude transmissivity ratio and to form a semi-transparent film pattern. Alternatively, a silicon nitride film is deposited by the CVD method while adjusting the quantity of ammonium in the raw material gas to control a nitrogen composition ratio, to adjust an amplitude transmissivity ratio and to form a semi-transparent film pattern.

Further, the fabrication steps preferably include a step for performing an additional ion implantation over the surface of the formed semi-transparent film pattern and a modification step for finely adjusting an amplitude transmissivity ratio by changing the crystalline state through a heat treatment step.

As a result of examination of an optical image intensity distribution projected on a wafer by changing a shifter transmissivity ratio through simulation, it has been found that, when a semi-transparent film pattern having a predetermined transmissivity ratio is used in place of a light blocking film pattern, its contrast can be improved.

In view of this respect, the prevent invention has been made and by employing the above-described arrangement, a fine pattern is easily resolved. Further, since patterning of the phase shifter is carried out together with the light blocking film pattern at a time, easy pattern control can be realized.

When it is desired to make the semi-transparent film in the form of a single layer, it becomes necessary to control the phase of light passing through the semi-transparent film to be within a range of 180 degrees ±10% with respect to the phase of light passing through the transparent film and also to set the transmissivity ratio of the semi-transparent film at a desired value.

In order to obtain a maximum resolution with use of a phase shift mask of the semi-transparent film, the optical constant of the semi-transparent film must satisfy the following conditions (1) and (2).

$$E1 = t1 \times E0 \quad (1)$$

$$E2 = t2 \times E0 \quad (2)$$

where E0 denotes a complex electric field vector for incident light, E1 denotes a complex electric field vector for light passed through the transparent film region, E2 denotes a complex electric field vector for light passed through the semi-transparent film region, and t1 and t2 denote amplitude transmissivity ratio, respectively. In order to obtain a maximum effect for such a phase shift mask as shown in FIG. 2, the following relationship (3) and (4) must be satisfied between the transmission light in the amplitude transmissivity ratio and phase difference.

$$0.1 \leq |E1|/I \leq 0.2 \quad (3)$$

$$170 \text{ degrees} \leq |\delta1 - \delta2| \leq 190 \text{ degrees} \quad (4)$$

where, $E1 = |E1|\exp(\delta1)$ $E2 = |E2|\exp(\delta2)$

The amplitude transmissivity ratios t1 and t2 for light passed through the semi-transparent film region and transparent film region are expressed by functions of air optical constant and the optical constants and thicknesses of the light transmissible substrate and semi-transparent film respectively. Shown in FIG. 25 is a range in which an optical constant (n,k) is satisfied when lithographic light is of an i ray and to meet the relationship (3) and (4). In other words, in order to fully exhibit the effect of the phase shift method, the optical constant of the semi-transparent film must be within an area defined by two curves a and b in FIG. 25.

The inventors of the present application have studied materials satisfying aforementioned conditions and found that the material satisfying the aforementioned two conditions is made of one or more of silicon, a compound including silicon, a mixture including silicon, germanium, a compound including germanium and a mixture including germanium. In particular, it is highly effective that a g-ray region is made of silicon and an i-ray KrF region as a semi-transparent film is made of SiN. Their performances are shown in Table 1.

TABLE 1

| Material | Formation of Film | Wavelength of Light (nm) | Thickness of Film (nm) | Amplitude Transmissivity to SiO$_2$ (%) |
|---|---|---|---|---|
| Si | Sputtering (Target:Si) | 436 | 61 | 17.4 |
| SiN | Sputtering (Target:SiN) | 365 | 446 | 20.0 |
| SiN | N$_2$ Flow Sputtering (Target:Si) | 365 | 76 | 15.0 |
| SiN | Sputtering (Target:SiN) | 248 | 267 | 17.0 |
| SiN | N$_2$ Flow Sputtering (Target:Si) | 248 | 80 | 15.0 |
| Ge | Sputtering (Target:Ge) | 436 | 70.3 | 10.8 |

By implanting such ions as As, P or B into transparent and semi-transparent films, the properties of the formed film, e.g., its optical constant can be adjusted to some extent.

Further, when the silicon film is heated to over 200° C., the silicon state can be changed continuously or intermittently from an amorphous state to a polycrystalline state or from the polycrystalline state to a single crystalline state to thereby obtain desired physical properties.

In accordance with the second embodiment of the present invention, the desired values can be obtained by controlling the composition ratio. Since the optical constant is inherent in the material, however, it is impossible to set the optical constant at an arbitrary value. Thus, the optimization of the optical constant can be realized, for example, by changing the composition ratio of a compound.

When the aforementioned conditions are satisfied, the desired phase difference and transmissivity ratio can be obtained with use of a single semi-transparent film.

For example, when silicon is used as a target and a semi-transparent film is formed in a mixture gas of argon and nitrogen by a spattering technique, relationship between the quantity of nitrogen gas and the optical constant is measured and such a variation curve D as shown in FIG. 25 is obtained. Reference symbol c denotes an optimum relationship curve and an allowable region c defined by the curves a and b and having a curve c disposed therebetween satisfies the relationship (3) and (4). An intersection of the curves c and D corresponds to the optimum value. As will be seen from the drawing, when the quantity of nitrogen is changed to adjust a refractive index and an amplitude transmissivity ratio and to form a silicon nitride film, a desired semi-transparent film pattern can be obtained. The obtained optimum conditions are that n=3.30 and k=1.19 when the quantity of nitrogen gas flow at the time of the sputtering is 15% and when the film thickness is set to be 83.5 nm, the amplitude transmissivity ratio is 0.1452 and the phase difference is 180 degrees, where lithographic light wavelength is 365 nm.

FIGS. 26 and 27 show optical constant ranges optimum for semi-transparent single-layer films when a KrF excimer laser beam (wavelength: 248 nm) and a g-beam (wavelength: 436 nm) are employed respectively.

Further, when a silicon nitride film is deposited by the CVD method while adjusting the quantity of ammonium in a raw material gas to control a nitrogen composition ratio or when a silicon di-oxide film is deposited by the CVD method while adjusting the quantity of oxygen in a raw material gas to control an oxygen composition ratio, the optimum amplitude transmissivity ratio and phase difference can be obtained as in the case of forming a semi-transparent film pattern by adjusting the amplitude transmissivity ratio.

BRIEF DESCRIPTION OF THE DRAWINGS

FIG. 19 shows a relationship between the shifter amplitude transmissivity ratio and the shifter width;

FIG. 20 (a)–(d) show diagrams for explaining a prior art phase shift technique;

FIG. 21 (a)–(d) show diagrams for explaining a second prior art phase shift technique;

FIG. 22 (a)–(d) show diagrams for explaining a third prior art phase shift technique;

DETAILED DESCRIPTION OF THE EMBODIMENTS

Embodiments of the present invention will be explained in detail with reference to the accompanying drawings.

Figure 1:
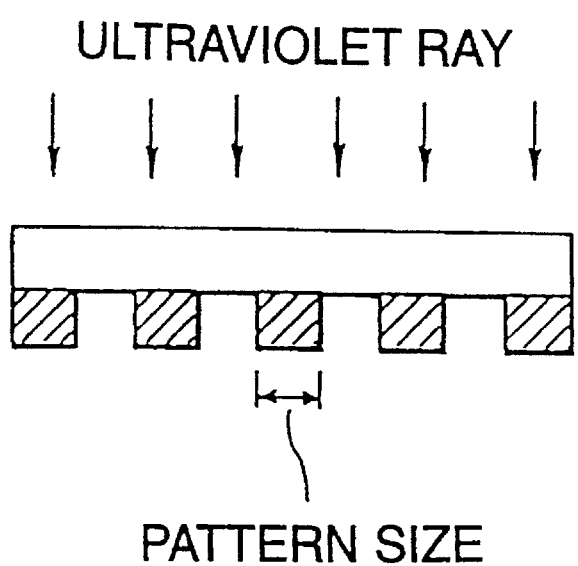
FIG. 1 shows a reticle in accordance with a first embodiment of the present invention.

Embodiment 1:

A reticle in accordance with a first embodiment of the present invention is shown in cross section in FIG. 1. The illustrated reticle, which is a 5-multiple mask, comprises a transparent quartz substrate 1, and a mask pattern 2 made of a semi-transparent film having a film thickness of 0.25 µm and a transmissivity ratio of 6% and having a line-and-space (minimum linewidth) of 1.5 µm. The minimum linewidth is transferred on the wafer to form a line-and-space pattern having a minimum linewidth of 0.34 µm.

The semi-transparent film is formed by mixing p-TER-PHENYL and PMMA at a mixture rate of 1:4, solving the mixture into an ethyl cellosolve acetate solution, rotatably coating the mixture solution to form a film of 0.25 µm thick on the substrate, and then developing the film to form a pattern having a line-and-space of 1.5 µm.

The reticle thus formed is mounted to a KrF excimer laser stepper having a projection lens with a numerical aperture NA of 0.42, a wafer coated with negative resist known as SAL601 is subjected to a pattern transfer ($\lambda k=248$ nm and coherency $\sigma=0.5$) and then to a development with use of a custom developing solution. As a result, a resist pattern having an accurate line-and-space (minimum linewidth) of 0.3 µm (which has not been obtained in the prior art reticle) can be obtained.

Figure 2:
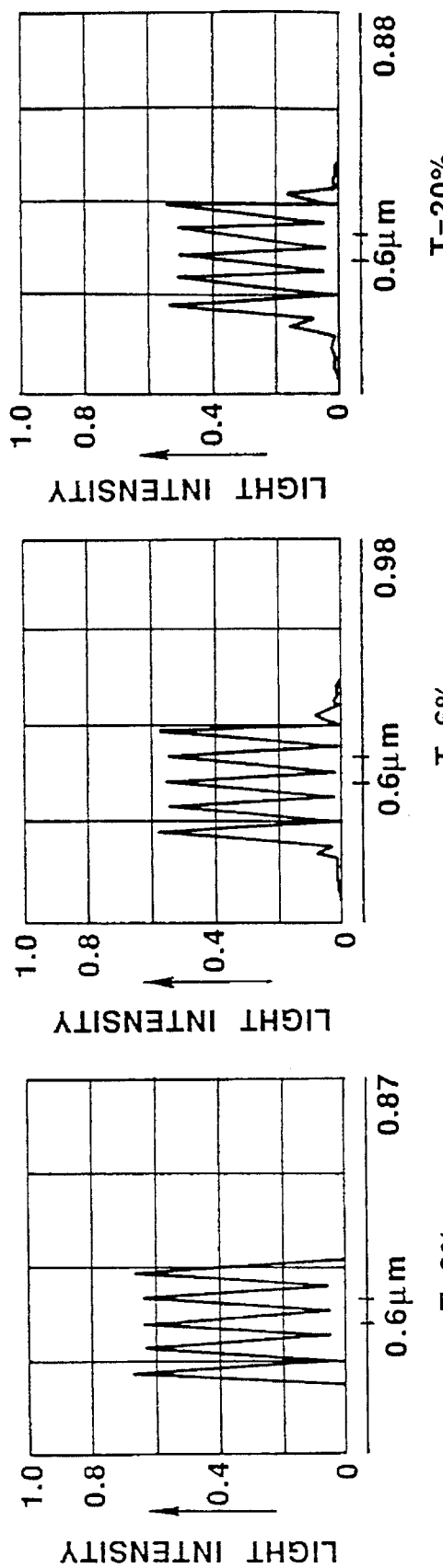
FIGS. 2(a), 2(b) and 2(c) are resultant light intensity distributions obtained when simulation is carried out by changing the transmissivity ratio of the reticle.

Subsequently, in order to find the optimum shifter transmissivity ratio in the equi-spaced line-and-space pattern, simulation is carried out with use of an originally prepared program for finding a light image intensity distribution, which result is shown in FIG. 2. As light exposure conditions, a beam emitted from a KrF excimer laser is used, and settings are made so that NA=0.42, λ=248 nm (λ/NA=0.59) and coherency λ=0.5. In this simulation, three sorts of masks are used which have the mask patterns 2 of semi-transparent films having three different transmissivity ratios T of 0% (chrome), 6% and 20% and also having a minimum linewidth of 0.3 µm, the mask patterns 2 being formed on the transparent quartz substrate 1 in the similar way to in FIG. 1. Such masks are subjected to measurements of variations in light image intensity distribution with respect to the different transmissivity ratios.

Shown in FIGS. 2(a) to 2(c) are resultant light intensity distributions obtained when the simulation is carried out with the transmissivity ratios T of the mask patterns of 0.3 µm in minimum linewidth changed to 0% (chrome), 6% and 20% respectively. It will be seen from the resultant light intensity distributions that valleys or bottoms in the light intensity distribution become substantially zero when T=6% while contrast is best improved when T=0%.

Figure 3:
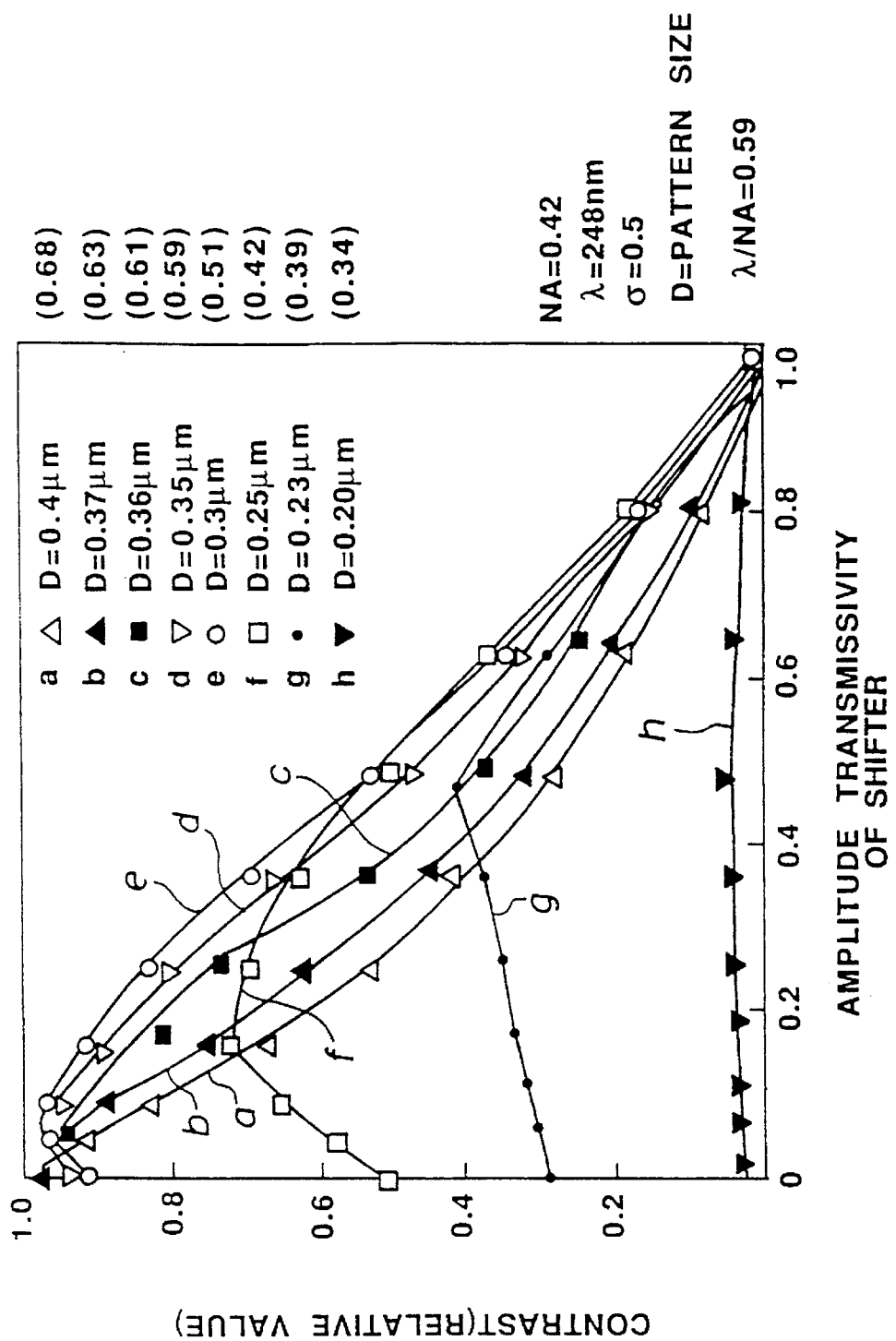
FIG. 3 is a graph showing relationship between the variation of transmissivity ratio and the variation of contrast with respect to different standard sizes determined by $\lambda/NA$.

The contrast is calculated in accordance with the following equation.

$$C=(I_{max}-I_{min})/(I_{max}+I_{min})$$

where, $I_{max}$ denotes the light intensity of the crest in the light intensity distribution waveform, $I_{min}$ denotes the light intensity of the bottom in the light intensity distribution waveform, and C denotes the contrast. FIG. 3 shows variations in the contrast caused by variations in the transmissivity ratios of patterns having different sizes determined by specifications with use of λ/NA. Curves a, b, c, d, e, f, g and h show relationship between the transmissivity ratio and contrast when the pattern sizes are 0.68 (0.40 µm), 0.63 (0.37 µm), 0.61 (0.36 µm), 0.59 (0.35 µm), 0.51 (0.3 µ), 0.42 (0.25 µm), 0.39 (0.23 µm) and 0.34 (0.20 µm) respectively.

With respect to the line-and-space, for the patterns having the pattern sizes of above 0.37 µm, as the shifter transmissivity ratio increases the contrast correspondingly decreases. The contrast becomes maximum at the transmissivity ratio 16% for the pattern having the pattern size of 0.25 µm, the contrast becomes maximum at the transmissivity ratio 6% for the pattern having the pattern size of 0.3 µm, and the contrast becomes maximum at the transmissivity ratio 3% for the pattern having the pattern size of 0.35 µm.

From the graph of FIG. 3, it will be appreciated that, when such a light blocking film as a chrome film is used for patterns having pattern sizes of above 0.36 µm (0.61 in the standard value) while when a semi-transparent shifter having a transmissivity ratio adjusted as varied from 0% to 20% is used for patterns having pattern sizes of below 0.36 µm, resolution of a fine pattern can be realized.

When the results of FIG. 3 are multiplied by λ/NA in the respective light exposure conditions, such a semi-transparent film can be obtained that has a transmissivity ratio causing the maximum contrast depending on the pattern size of the light exposure conditions.

Further it will be seen from FIG. 3 that, when such a light blocking film as a chrome film is used for patterns having pattern sizes of above 0.61 while when a semi-transparent film having a transmissivity ratio adjusted in a range of from 0% to 50% is used for patterns having pattern sizes of below 0.61, the contrast can be improved. It will be also appreciated that the optimum transmissivity ratio is 50% for a standard size of 0.39 and adjustment of the transmissivity ratio at a value larger than 50% causes no effect for a standard size of 0.34 smaller than 0.39. The adjustment of the transmissivity ratio may be carried out by adding a pigment to the semi-transparent film.

Figure 4A:
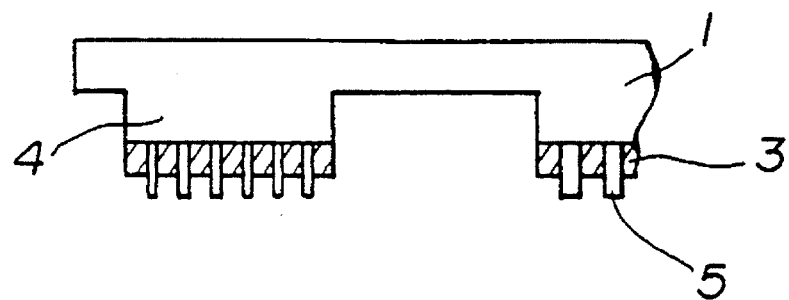
FIGS. 4(a) and 4(b) show a second embodiment of the present invention.
Figure 4B:
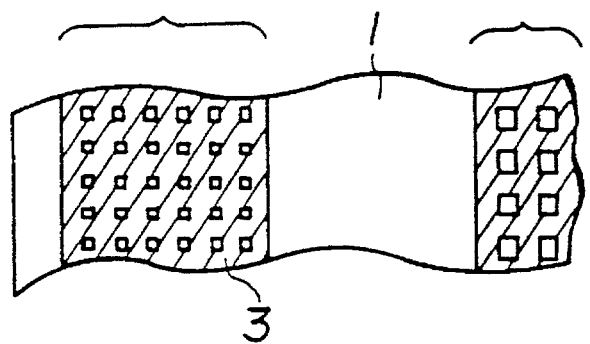

Embodiment 2:

Explanation will next be made as to a second embodiment of the present invention. FIGS. 4(a) and 4(b) shows major parts of a reticle of the second embodiment of the present invention.

The reticle of this embodiment is featured in that a plurality of films having different amplitude transmissivity ratios are arranged in a pattern of a resolution limit below that of a lithographic optical system, and the amplitude transmissivity ratio is controlled by adjusting the occupied area ratio of the films according to the pattern size so as to obtain the optimum amplitude transmissivity ratio for each pattern size, thereby to improve the resolution limit.

In the reticle, lithographic light has a wavelength of about 436 nm, the lithographic light passed through a semi-transparent film pattern as a phase shifter is subjected to a phase inversion of 180 degrees and then added to the lithographic light not passed through the semi-transparent pattern so that light intensity becomes sharp at pattern boundaries.

Steps of fabricating the reticle will now be explained.

Figure 5A:
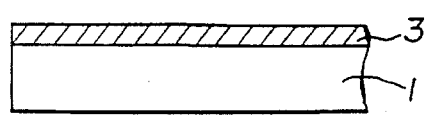
FIGS. 5(a) through 5(g) show steps of fabricating the reticle.

As shown in FIG. 5(a), first of all, a light-transmissible molten crystal substrate 1 of a square having a side length of 5 inches and of 2.4 mm thick is subjected to a sputtering process to deposit thereon a semi-transparent Cr film 3 having a thickness of 0.035 µm.

Figure 5E:
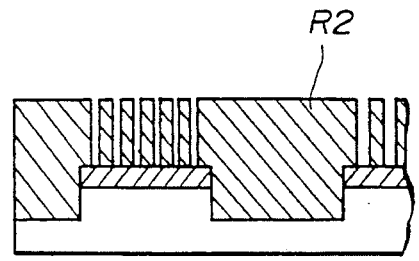
Figure 5B:
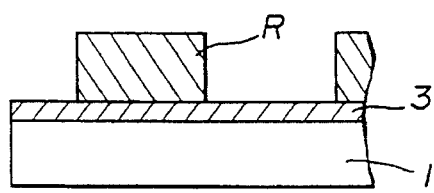

Subsequently, as shown in FIG. 5(b), the resultant reticle is coated thereon with resist R and then subjected to a photolithography process using electron beam (EB) to be patterned.

Figure 5F:
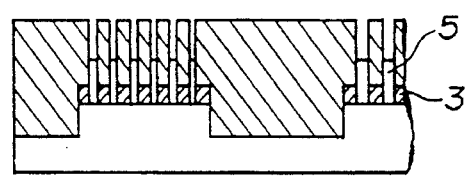
Figure 5C:
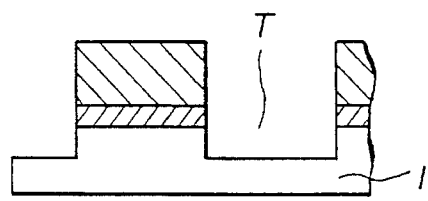

Thereafter, as shown in FIG. 5(c), the Cr film 3 is subjected to a reactive ion etching operation with use of the resist pattern R as a mask and with use of a reactive gas containing, as main components, $CH_2Cl_2$ and $O_2$ gases to be patterned. The resultant substrate is then subjected to a dry etching operation with use of a gas containing $CF_4$ as a main component, whereby the substrate 1 is etched by an amount of about 0.42 µm. A region 4 not bitten or etched through the etching becomes a phase adjustment region. At this time, an etched amount $d_2$ in the substrate 1 meets the following equation.

$$(n_1-1) \times d_1/\lambda + (n_2-1) \times d_2/\lambda = 0.5$$

where $n_1$ denotes the refractive index of Cr, $d_1$ denotes the thickness of the Cr film, $n_2$ denotes the refractive index of the crystal substrate, and $d_2$ denotes the etched amount in the crystal substrate.

Figure 5G:
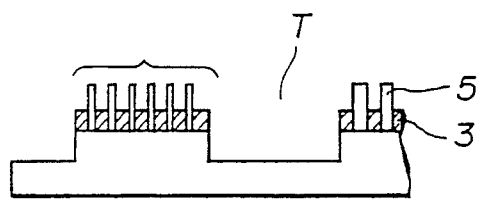
Figure 5D:
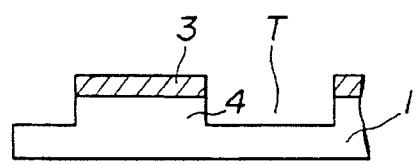

Further, as shown in FIG. 5(d), the resultant substrate is immersed into a mixture solution of sulfuric acid and hydrogen peroxide to selectively remove only the resist pattern R.

After this, as shown in FIG. 5(e), a resist pattern R2 is formed on the resultant substrate to process the Cr film 3 into a fine pattern.

As shown in FIG. 5(f), the resultant substrate is subjected to a dry etching with use of the resist pattern R2 as a mask and with use of a reactive gas containing, as main components, $CH_2Cl_2$ and $O_2$ gases to obtain a patterned semi-transparent film made of the Cr film 3 and then subjected to a liquid phase growth process to selectively form a silicon di-oxide film 5 defined by the resist pattern. The thickness of the silicon di-oxide film 5 is set so that a phase difference between the lithographic light passed through the Cr film 3 and the lithographic light passed through the silicon di-oxide film 5 becomes zero.

Finally, the resist R2 is removed with use of an suitable organic solvent or acid to complete a reticle (see FIG. 5(g)).

The phase shifter in the reticle thus-fabricated is arranged so that the occupied area ratio between the fine patterns of the Cr film 3 and silicon di-oxide film 5 is adjusted according to the pattern size to obtain an optimum pattern.

The film thickness is determined on the condition that the lithographic light for use of the lithographic light exposure of the reticle has a wavelength of 436 nm.

The reticle thus fabricated is mounted in a g-ray stepper having a projection lens with a numerical aperture (NA) of 0.42 so that the novolac positive resist PR-1024 of 0.5 μm thick coated on a substrate to be processed is subjected to a lithographic light exposure, whereby a extremely high reproducibility up to a 0.3 μm pattern can be obtained.

In this case, since a desired amplitude transmissivity ratio is obtained by adjusting occupied area ratio between the fine patterns of the semi-transparent Cr film 3 and silicon di-oxide film 5, the control of the amplitude transmissivity ratio according to the pattern size can be facilitated.

Although the Cr film 3 and the silicon di-oxide film 5 define steps in the foregoing embodiment, such steps may be removed and the optical characteristics may be further improved when materials having close refractive indexes, for example, a chrome oxide film and a silicon di-oxide film are combined.

The present invention is not limited to Cr as the material of the semi-transparent film but any metallic material or other suitable material may be employed. That is, any material may be employed by setting the film thickness to be thin. Further, the invention is not restricted to silicon di-oxide as the transparent film but such materials as calcium fluoride (CaF), magnesium fluoride (MgF) or aluminum oxide ($Al_2O_3$) may be employed.

Embodiment 3:

Detailed explanation will then be made as to a third embodiment of the present invention.

The present embodiment, which is based on the fact that transmissivity ratio can be gradually changed by ion implantation, is featured in that fine adjustment of the amplitude transmissivity ratio can be realized.

Figure 6A:
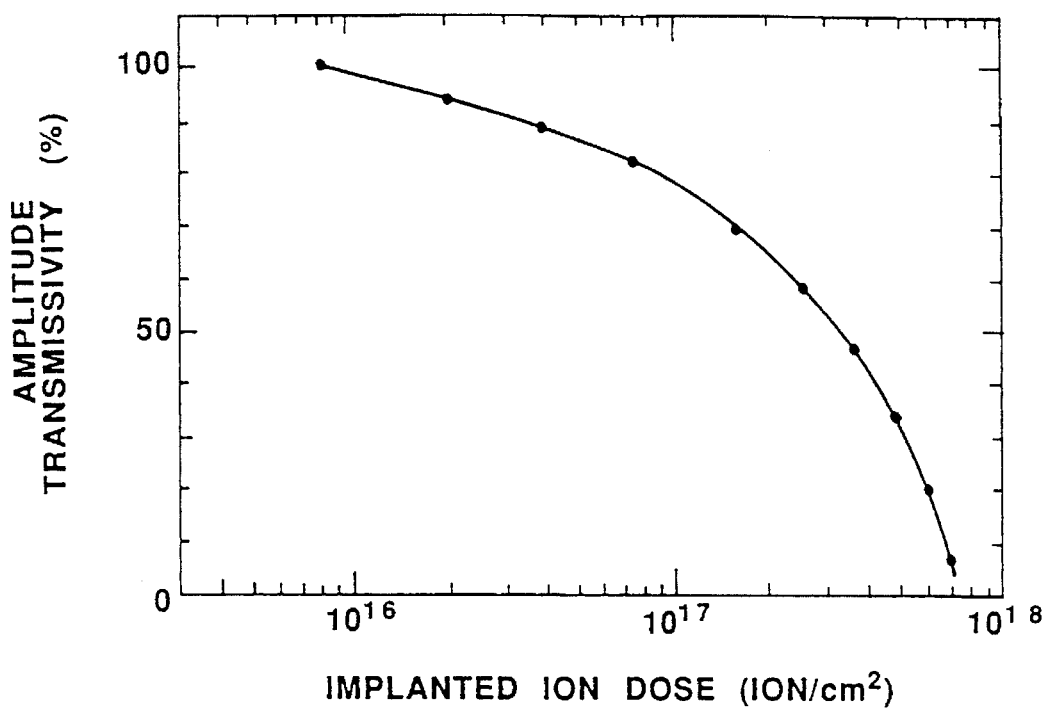
FIGS. 6(a) and 6(b) show relationship between implanted-ion dose and transmissivity ratio.

A transparent substrate of molten crystal is subjected thereon to an ion implantation with use of silicon ions and an acceleration voltage of 30 KeV and then subjected to measurements at a wavelength of 436 nm. The measurement result is shown in FIG. 6(a) wherein a horizontal axis represents implanted ion dose and a vertical axis represents transmissivity ratio. It will be seen from the drawing that the transmissivity ratio monotonously decreases as the dose increases.

In the case of this reticle, lithographic light having a wavelength of 436 nm is used so that the lithographic light passed through the semi-transparent film pattern as the phase shifter is inverted by 100 degrees and then added to the lithographic light not passed through the semi-transparent film pattern, whereby light intensity is sharpened at pattern boundaries.

Explanation will next be made as to how to fabricate the reticle.

Figure 7A:
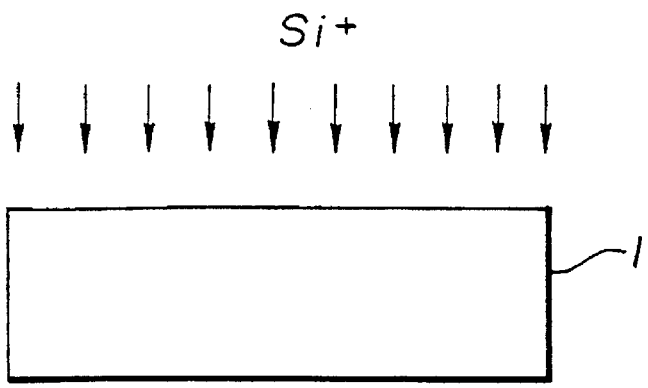
FIGS. 7(a) through 7(d) show steps of fabricating a reticle in accordance with a third embodiment of the present invention.

First, as shown in FIG. 7(a), a light-transmissible, molten crystal substrate 1 of 2.4 mm thick and of a square shape each having a side length of 5 inches is subjected to a silicon ion implantation with use of a dose of $7.0\times10^{17}/cm^2$ and an acceleration voltage of 30 KeV uniformly all over the entire surface thereof to form a semi-transparent layer 6. The resultant semi-transparent layer 6 has a transmissivity ratio of 6% with respect to lithographic light having a wavelength of 436 nm.

Figure 7B:
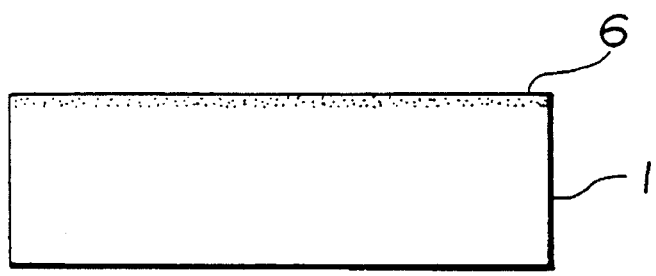

Thereafter, as shown in FIG. 7(b), the resultant substrate is coated thereon with resist R and then subjected to an EB lithographic process for patterning.

Figure 7C:
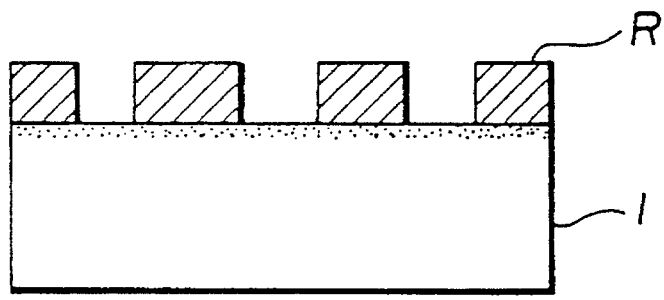
Figure 7D:
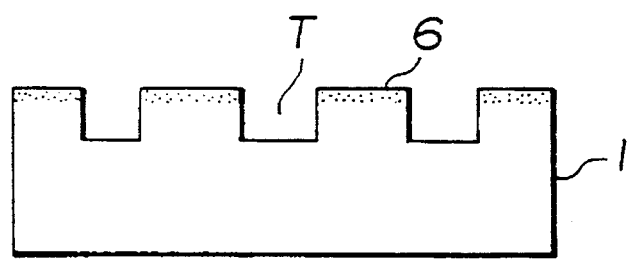

Next, as shown in FIG. 7(c), the resultant substrate is subjected to a reactive ion etching operation with use of the resist pattern R as a mask and a reactive gas containing, as a major component, $CF_4$ gas to form grooves T therein having an etched depth of about 0.47 μm. A region not etched through the etching operation corresponds to a phase adjustment region.

A reticle thus formed is mounted in a g-ray stepper having a projection lens with an NA of 0.42 and the novolac positive resist PR-1024 of 0.5 μm thick coated on a substrate to be processed is subjected to lithographic light, whereby a very high reproducibility up to a 0.3 μm pattern can be obtained.

The semi-transparent layer in the thus-fabricated reticle may be formed so that the dose or acceleration voltage is varied according to the pattern size or writing with use of a focused ion beam (FIB) technique is carried out to form a fine ion-implanted region and to obtain an optimum pattern.

Figure 6B:
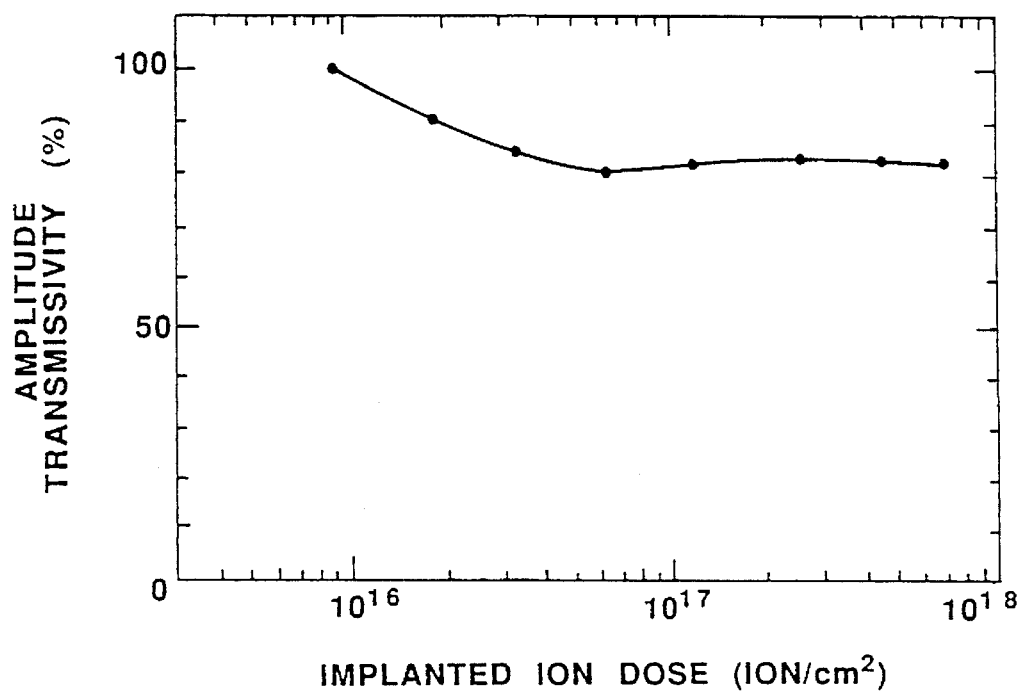

Although silicon ion implantation has been carried out in the foregoing embodiment, the present invention is not limited to only the silicon ions but other suitable ions may be suitably employed. When Au ions are implanted under the same implantation conditions as shown in FIG. 6(a), however, the transmissivity ratio is saturated at 80% as the dose is increased and a further increase of the dose results in impossible adjustment as shown in FIG. 6(b). Accordingly, it is necessary to select such ion and implantation energy that the transmissivity ratio monotonously varies as the dose of implantation ions increases.

Embodiment 4:

A fourth embodiment of the present invention will be detailed. In the present embodiment, ion implantation is carried out through a resist pattern to selectively form a semi-transparent layer.

Explanation will then be made as to how to fabricate the reticle.

Figure 8A:
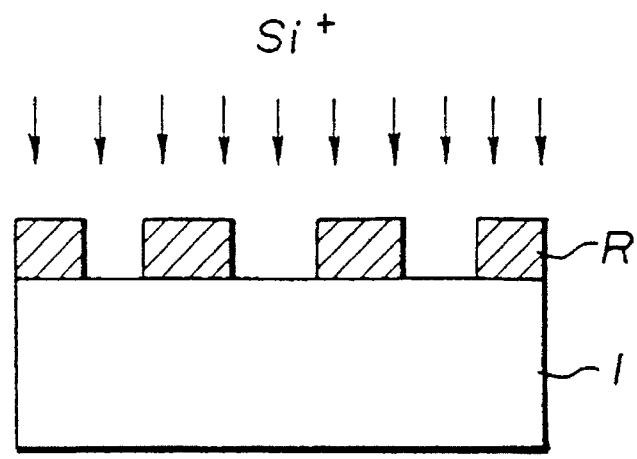
FIGS. 8(a) through 8(d) show steps of fabricating a reticle in accordance with a fourth embodiment of the present invention.
Figure 8B:
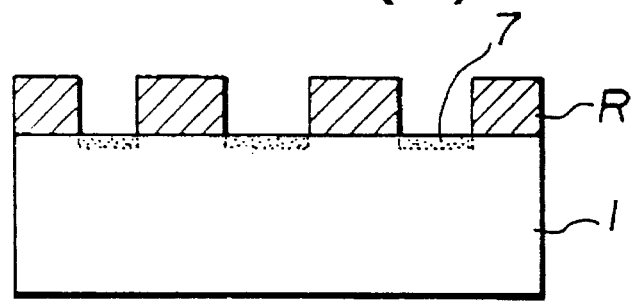

First, as shown in FIG. 8(a), a light-transmissible, molten crystal substrate 1 of 2.4 mm thick and of a square shape each having a side length of 5 inches is coated thereon with resist R, subjected to an EB lithography process for patterning, and then subjected to a silicon ion implantation uniformly all over the surface thereof through the resist pattern R to form a semi-transparent layer 7 as shown in FIG. 8(b). At this time, when the resist pattern R in the pattern region is arranged to be adjusted with respect to each transfer pattern size, the transmissivity ratio can be controlled to have a desired value for each region.

Figure 8C:
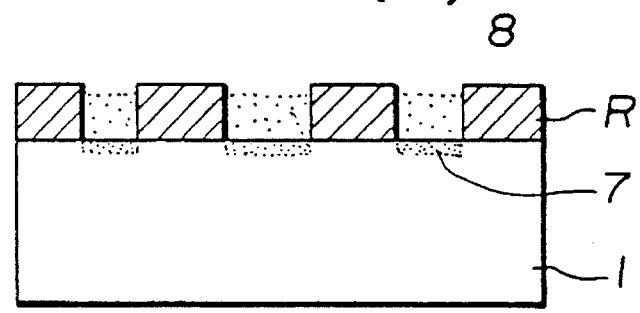

Then selectively formed on the resultant substrate is a silicon di-oxide film 8 defined by the resist pattern through a liquid phase growth process. In this case, the thickness of the silicon di-oxide film 8 is selected so that a phase difference between the lithographic light passed through the semi-transparent layer 7 and the lithographic light passed through the transparent substrate becomes 180 degrees (refer to FIG. 8(c)).

Figure 8D:
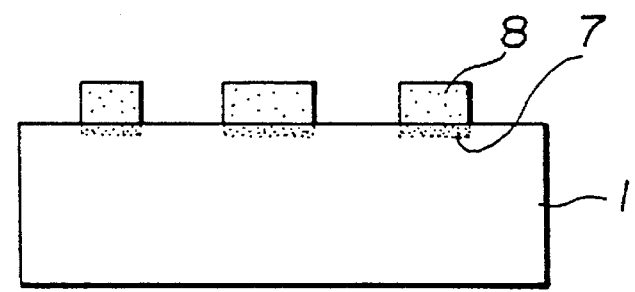

Finally, the resist R is removed with use of suitable organic solvent or acid to complete a reticle (Refer to FIG. 8(d)).

The phase shifter in the thus-formed reticle is arranged so that the occupied area ratio of the fine patterns of a stacked layer structure of the silicon di-oxide film 8 and semi-transparent layer 7 is adjusted according to the pattern size to obtain an optimum pattern.

Embodiment 5:

A fifth embodiment of the present invention will be detailed below.

Figure 9:
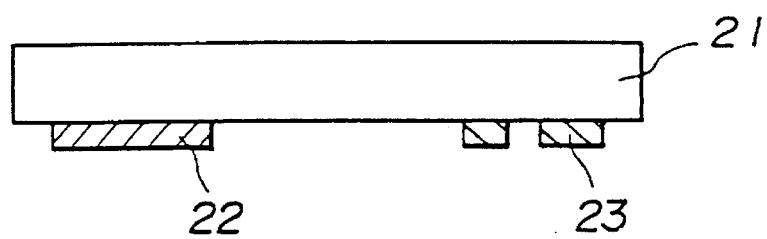
FIG. 9 shows a fifth embodiment of the present invention.

FIG. 9 shows the cross-sectional view of a reticle in accordance with the fifth embodiment of the present invention. The reticle comprises a transparent quartz substrate 21 and mask patterns 22 and 23 formed on one surface of the substrate 21 and having different sizes. More specifically, such a light blocking film 22 as a chrome film is used for a pattern having a pattern standard size of 0.61 or more, while the semi-transparent film 23 is used for a pattern having a pattern standard size of less than 0.61, the semi-transparent film being set to be in a transmissivity ratio range of 0–50%. In this case, all the patterns formed on the mask have a very good contrast and the resolution is also remarkably increased.

Embodiment 6:

A sixth embodiment of the present invention will next be explained in detail.

Figure 10:
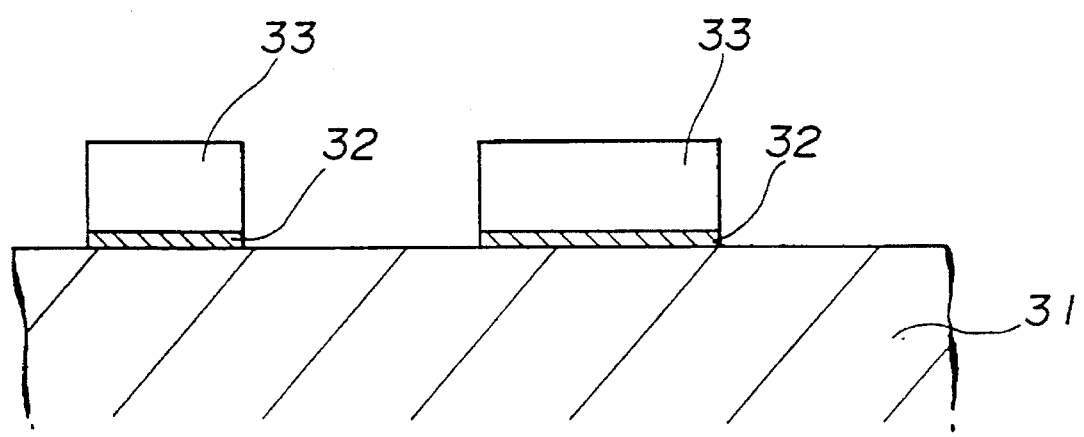
FIG. 10 shows a reticle in accordance with a sixth embodiment of the present invention.

FIG. 10 shows the cross-sectional view of a reticle in accordance with the sixth embodiment of the present invention. In the reticle, a chrome light blocking film (not shown) is used for a pattern having a size of 0.37 μm or more (0.61 or more in the standard value), while a semi-transparent pattern having a transmissivity ratio adjusted to be in a range of from 0% to 20% is used for a pattern having a size of less than 0.37 μm, whereby resolution of a fine pattern can be realized.

That is, the reticle is featured by comprising a transparent quartz substrate 31, a semi-transparent film 32 of a thin chrome film formed on the substrate 31 to have an amplitude transmissivity ratio of 25% (6.25% in light intensity transmissivity ratio), and a transparent silicon di-oxide film 33 as a phase shifter formed on the top of the semi-transparent film 32. The silicon di-oxide film 33 acts as a phase shifter to incident exposure light. The exposure light passed through the transparent silicon di-oxide film 33 as the phase shifter is inverted by 100 degrees and then added to exposure light not passed through the phase shifter 33, so that the added exposure light is sharp in light intensity at the pattern boundaries.

Figure 11A:
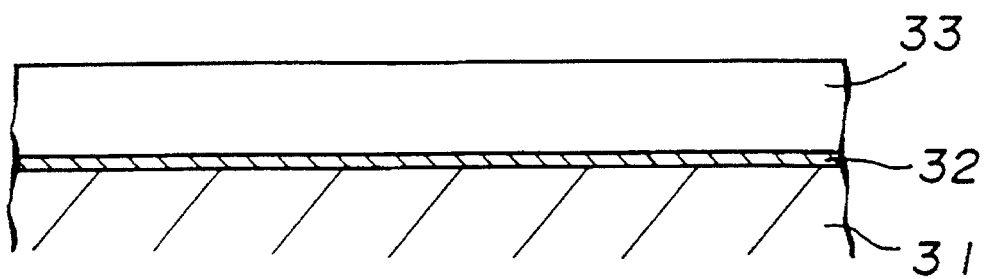
FIGS. 11(a) through 11(c) show steps of fabricating the reticle.

Explanation will next be made as to steps for fabricating the reticle. First, as shown in FIG. 11(a), the thin semi-transparent film 32 of Cr is formed on one surface of the light-transmissible quartz substrate 31 by a sputtering technique and then the silicon di-oxide film 33 acting as a phase shifter of exposure light is deposited on the top of the semi-transparent film 32. In the present embodiment, the thickness of the silicon di-oxide film 33 as the phase shifter is set to provide a phase shift of 180 degrees.

Figure 11B:
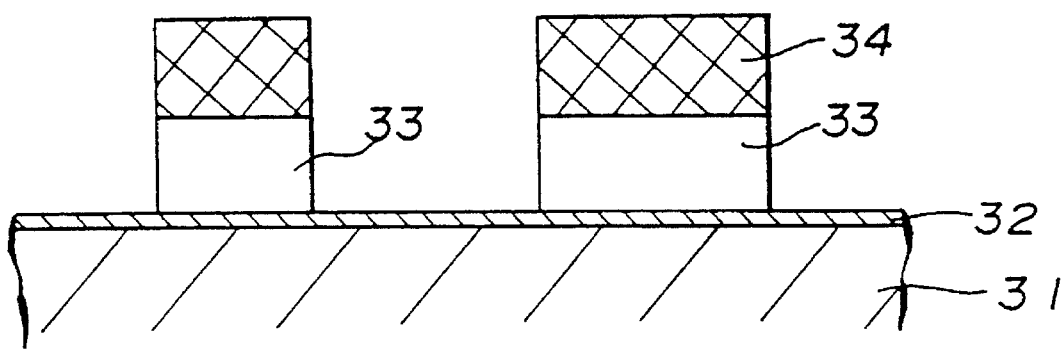

As shown in FIG. 11(b), the resultant substrate of FIG. 11(a) is coated with a resist 34, subjected to a patterning operation by a lithography based on electron beam (EB) exposure. The silicon di-oxide film 34 is then subjected to a patterning operation with use of the patterned resist 34 as a mask by means of a reactive ion etching using a reactive gas containing a $CF_4$ gas as its main component.

Figure 11C:
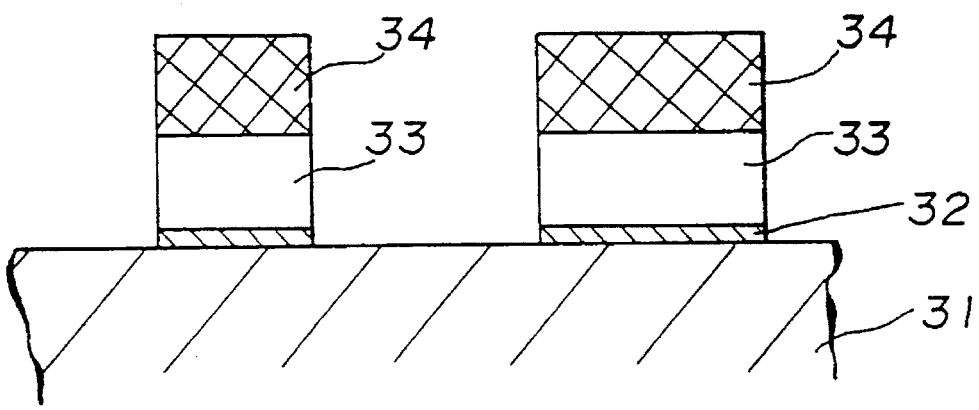

As shown in FIG. 11(c), the thin semi-transparent film 32 of Cr material is subjected to a patterning operation by a dry etching with use of $CH_2Cl_2$ and $O_2$ as main components and the resist 34 is removed with use of an organic solvent or acid, thus completing a reticle.

Since the phase shifter of the reticle thus fabricated is made in the form of patterns of the semi-transparent film 32 and the silicon di-oxide film 33 as an inorganic film, even in the case where the mask is repetitively cleaned in the fabrication steps of a VLSI, the mask has a strength sufficiently able to withstand the repetitive cleaning operations and thus is long in operational life and high in reliability.

The thickness of the film is determined in the case where an ultraviolet light having a wavelength of 436 nm emitted from a KrF excimer laser is used as the exposure light of the reticle. In the present embodiment, the thickness of the silicon di-oxide acting as the phase shifter is set to be $\lambda/2(n-1)$, where $\lambda$ denotes the wavelength of the exposure light and n denotes the refractive index of the silicon di-oxide film.

When the thus-fabricated reticle is mounted to a g-ray stepper having a projection lens with a numerical aperture NA of 0.42 so that 0.5 μm of novolac positive resist PR-1024 coated on a substrate to be processed is subjected to a light exposure, 0.3 μm of pattern can be reproduced with a very high accuracy.

For comparison, when light exposure is carried out with use of a conventional reticle without the formation of the phase shifter layer and having exactly the same structure as the foregoing embodiment except for the non-formation of the phase shifter layer, its resultant resolution is about 0.4 μm at most. It will also be seen from the solution comparison that, when the reticle fabricated according to the embodiment of the present invention as well as the photolithography using the mask are employed, a highly accurate pattern can be obtained.

The material of the semi-transparent film is not limited to Cr but may also be other metallic material or material. That is, any material may be employed therefor, for example, by setting the film thickness to be thin. Further, the material of the transparent film is not restricted to silicon di-oxide but such other material as calcium fluoride (CaF), magnesium fluoride (MgF) or aluminum oxide ($Al_2O_3$) may be also used. Furthermore, an anti-reflection film made of magnesium fluoride or the like may be formed on the top or bottom of the pattern by a sputtering.

Embodiment 7:

FIG. 12 shows cross-sectional views of steps for fabricating a reticle in accordance with a seventh embodiment of the present invention. The feature of the present reticle is that a Cr film pattern of 100 nm thick is formed on one surface of a light-transmissible quartz substrate 11, on which formed is a phase shifter 121 having a shifter width of 0.6 μm as a semi-transparent film having a film thickness of 0.25 μm and a transmissivity ratio of 30%.

Figure 12A:
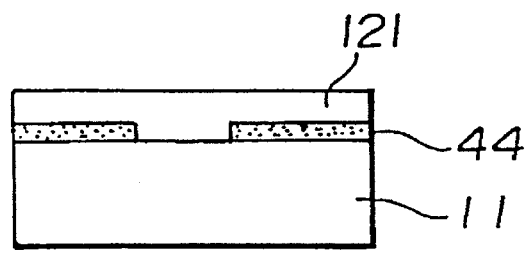
FIGS. 12(a) through 12(d) show steps of fabricating a reticle in accordance with a seventh embodiment of the present invention.

First, as shown in FIG. 12(a), a mixture of p-TERPHE-NYL and PMMA at a mixture rate of 1:4 is solved into an ethyl cellosolve acetate solution and then rotatably coated on one surface of the light-transmissible quartz substrate 11 coated thereon with a Cr film pattern of 100 nm thick to thereby form a film of 0.25 μm thick thereon. The phase shifter has an amplitude transmissivity ratio of 30%.

Figure 12B:
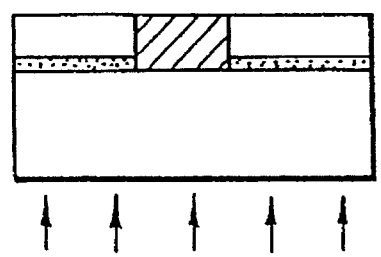
Figure 12C:
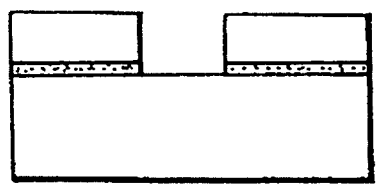
Figure 12D:
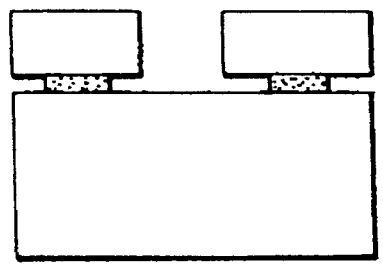

Next, as shown in FIG. 12(b), the resultant substrate of FIG. 12(a) is subjected to a backside light exposure having a wavelength of 200–300 nm with use of a mercury lamp. As shown in FIG. 12(c), the substrate of FIG. 12(b) is then subjected to a developing operation with use of a custom developing solution TSK. Thereafter, as shown in FIG. 12(d), the substrate of FIG. 12(c) is subjected to a side etching with use of a cerium (II) nitrate ammonium solution so that a shifter width on the mask becomes 0.6 μm, whereby a mask is completed.

The thus-fabricated reticle is mounted to the KrF excimer laser stepper having a projection lens with a numerical aperture of 0.42 so that a wafer having a negative resist known as SAL601 coated on a silicon substrate is subjected to a pattern transfer ($\lambda=248$ nm and coherency $\sigma=0.5$) and then developed with use of a custom developing solution.

As a result, resist patterns with fine minimum linewidths (or line-and-space) of 0.25 μm and 0.3 μm can be obtained, which can not be obtained in conventional reticles.

Figure 13A:
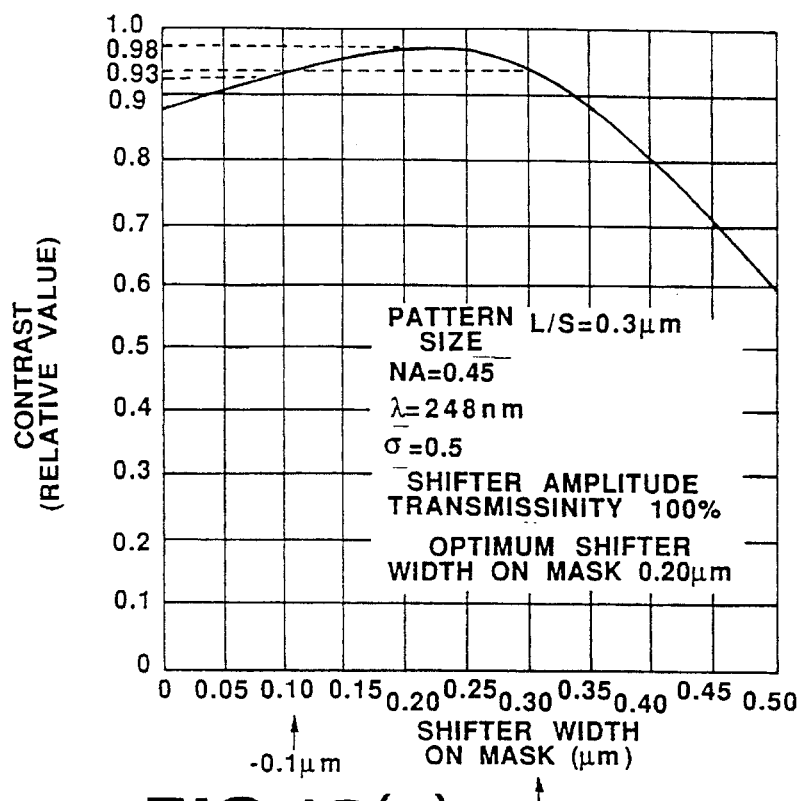
FIGS. 13(a) and 13(b) are graphs showing relationship between shifter width and contrast in the embodiment.
Figure 13B:
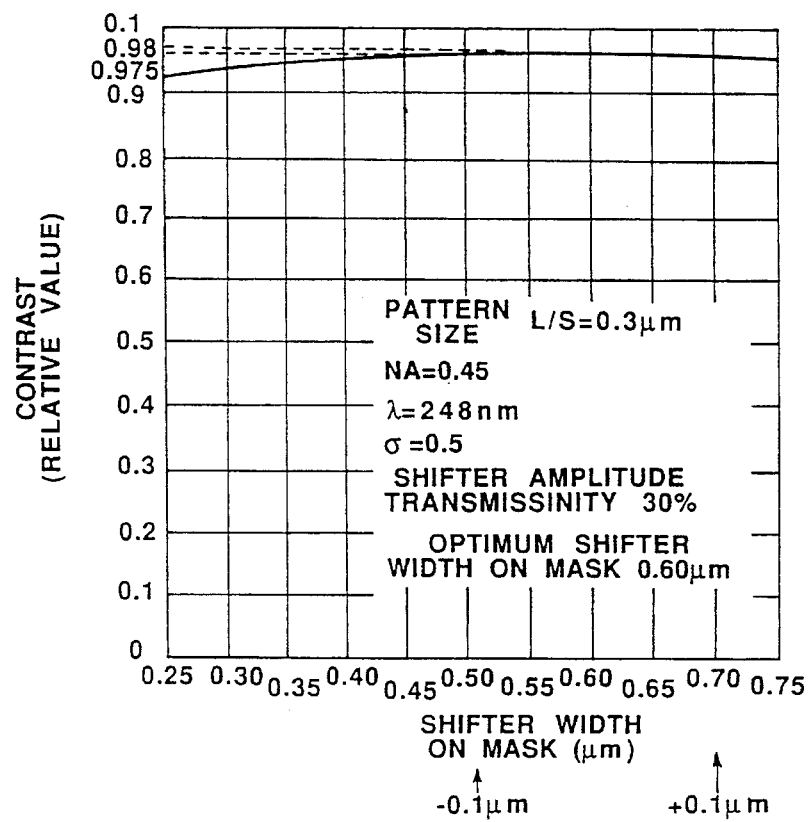

When the prior art shifter has an amplitude transmissivity ratio of 100%, the optimum shifter width for a pattern size of 0.3 µm is 0.2 µm on the mask, which results in generation of variations of about ±0.1 µm. A reduction in the contrast caused by an error in the shifter width is as fairly large as 0.05 (in relative value) as shown in FIG. 13(a). When the phase shifter has an amplitude transmissivity ratio of 30% and an optimum shifter width of 0.6 µm, on the other hand, a reduction in the contrast caused by even an error of ±0.1 µm is as very small as 0.005 as shown in FIG. 13(b).

In this way, by reducing the transmissivity ratio of the shifter to increase the shifter width, a reduction in the contrast caused by the shifter width error can be suppressed and consequently a good resist pattern can be provided.

Figure 14:
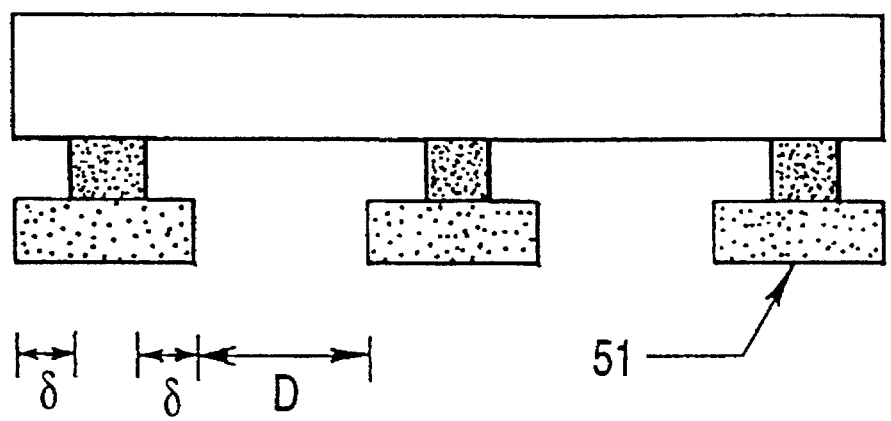
FIG. 14 shows a reticle in accordance with an eighth embodiment of the present invention.
Figure 15A:
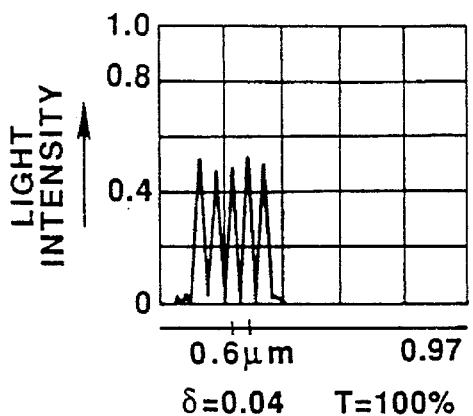
FIGS. 15(a) through 15(e) are graphs showing relationship between light intensity distribution and contrast with respect to different shifter amplitude transmissivity ratios and shifter widths.
Figure 15D:
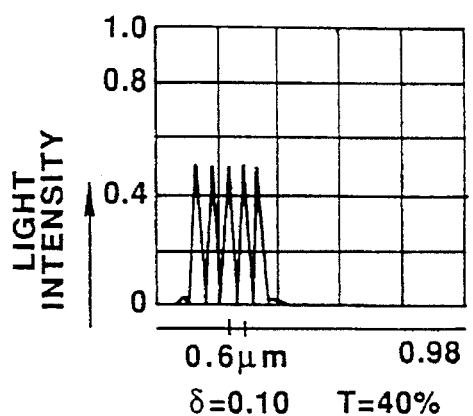
Figure 15B:
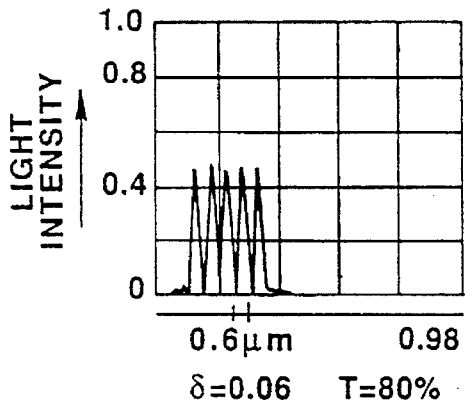
Figure 15E:
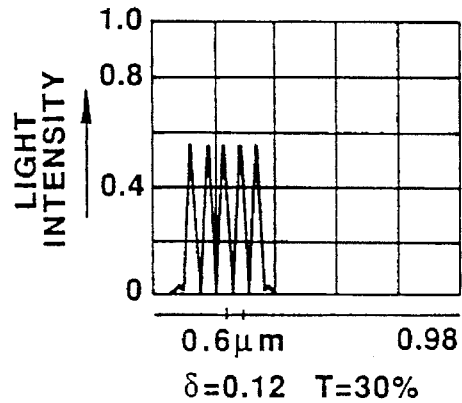
Figure 15C:
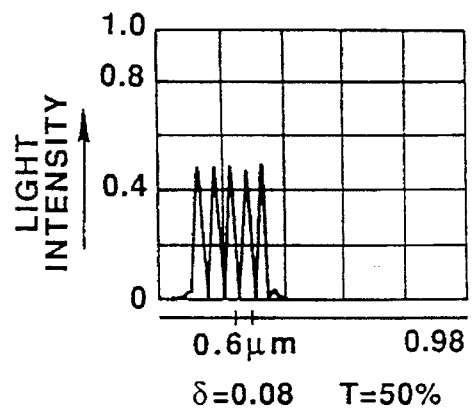

Embodiment 8:

Next, for the purpose of obtaining the optimum relationship between the amplitude transmissivity ratio and a shifter width in such an equi-spaced line-and-space pattern as shown in FIG. 14, simulation is carried out with use of a program for finding a light image intensity distribution. As the light exposure conditions, a laser beam emitted from a KrF excimer laser is used as exposure light, and settings are made so that NA=0.42, λ=248 nm and coherency σ=0.5. Combinations of the amplitude transmissivity ratio and shifter width producing the highest contrast when the amplitude transmissivity ratio and shifter width are varied are shown in FIGS. 15(a) to 15(e). It will be seen from the results of the drawings that the smaller the amplitude transmissivity ratio is the larger the shifter width is.

Figure 16:
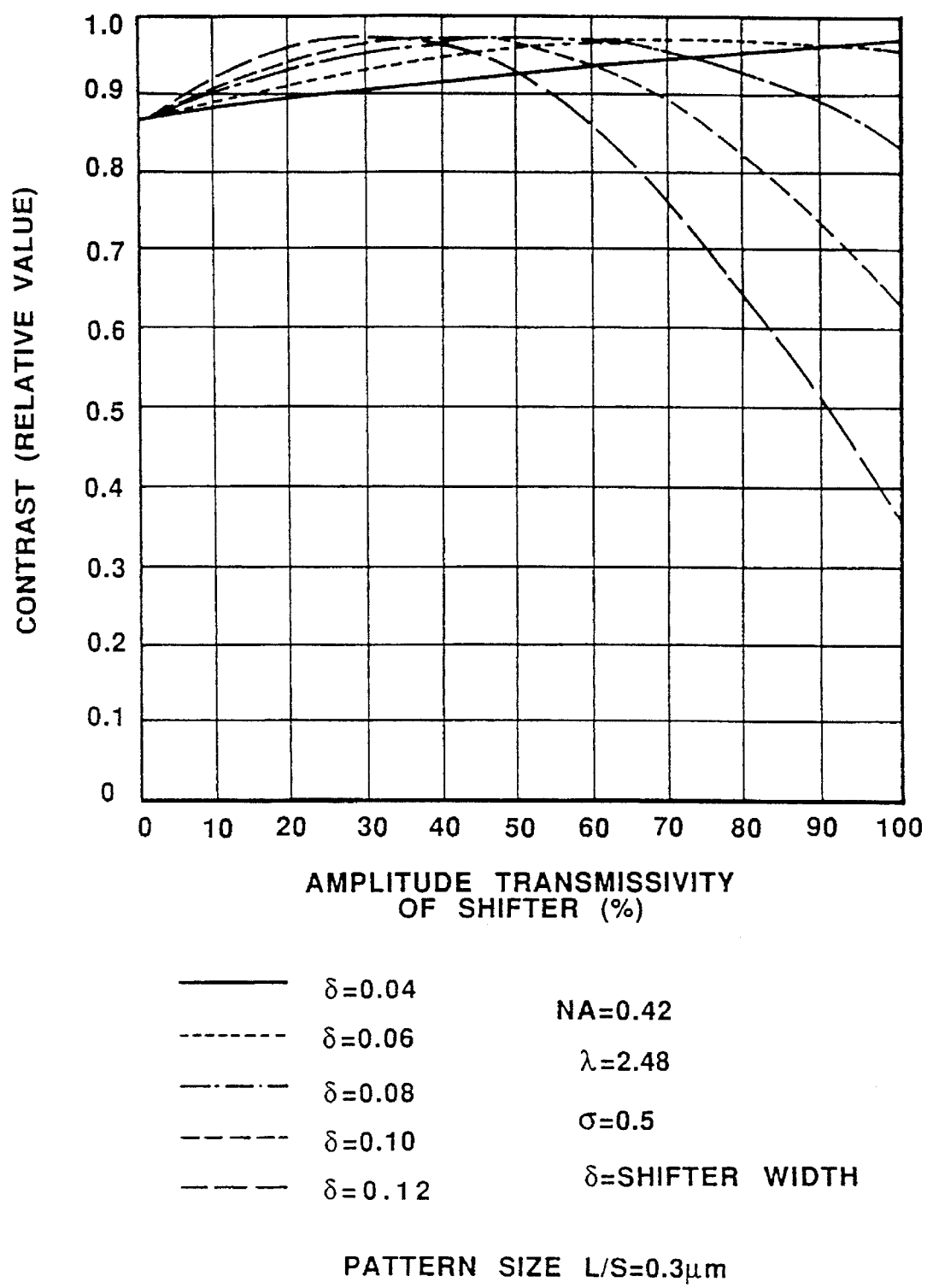
FIG. 16 is a graph showing relationship between the shifter amplitude transmissivity ratio and the contrast of light intensity distribution with respect to different shift widths.
Figure 17:
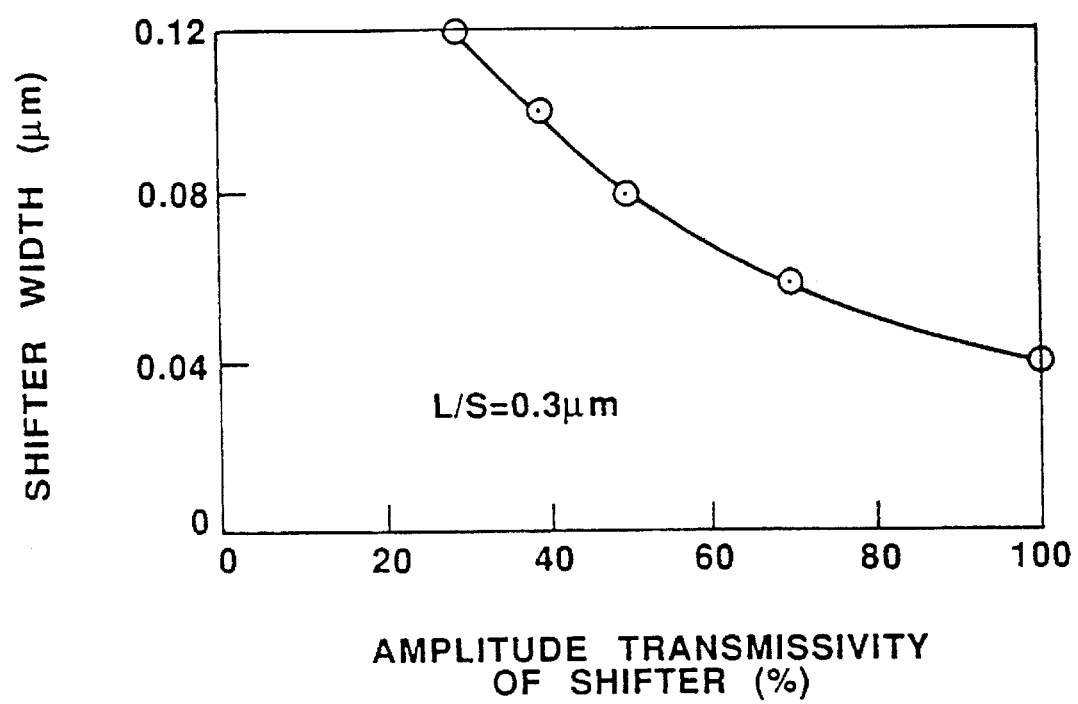
FIG. 17 shows a relationship between the shifter amplitude transmissivity ratio and the shifter width.

FIG. 16 shows variations in the contrast of the light image intensity distribution when the shifter width is fixed and the amplitude transmissivity ratio is varied in a mask pattern having a line-and-space (minimum linewidth) of 0.3 µm. It will be seen from FIG. 16 that the amplitude transmissivity ratio of the shifter causing the maximum contrast varies from shifter width to shifter width. Shown in FIG. 17 are measurement results showing a relationship between the shifter amplitude transmissivity ratio and the shifter width when the contrast is maximum. It will be appreciated from the drawing that, as the shifter amplitude transmissivity ratio is decreased, the shifter width is increased.

Figure 18:
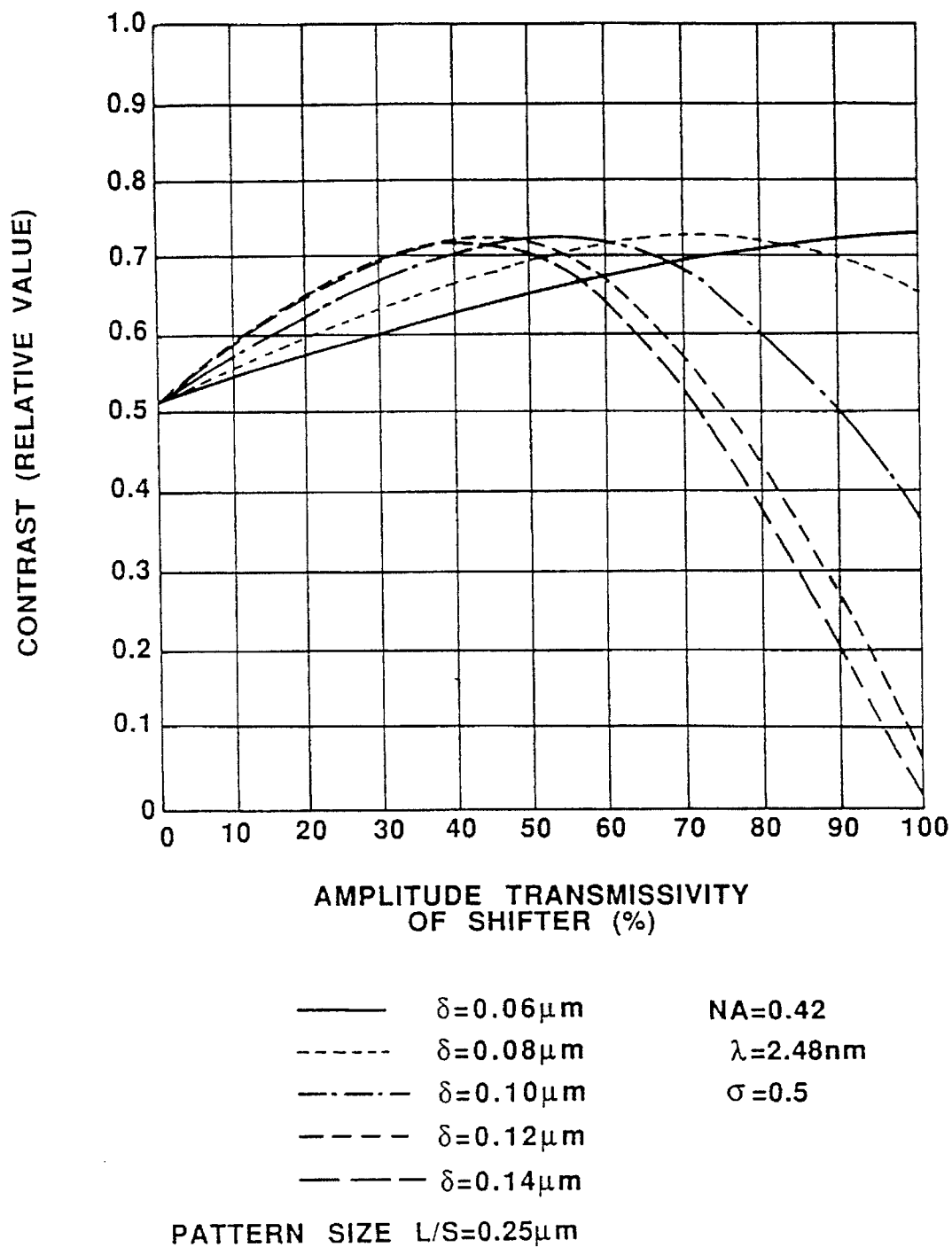
FIG. 18 is graph showing relationship between light intensity distribution and contrast with respect to different shifter amplitude transmissivity ratios and shifter widths.
Figure 23A:
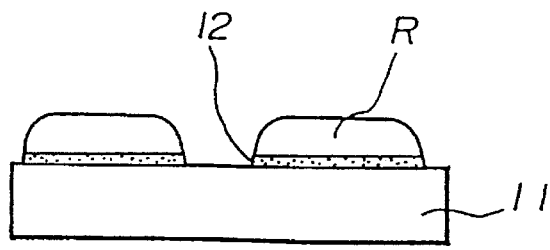
FIGS. 23(a) through 23(e) show diagrams for explaining a fourth prior art phase shift technique.
Figure 23B:
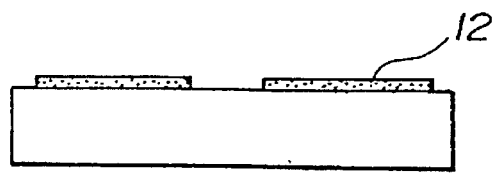
Figure 23C:
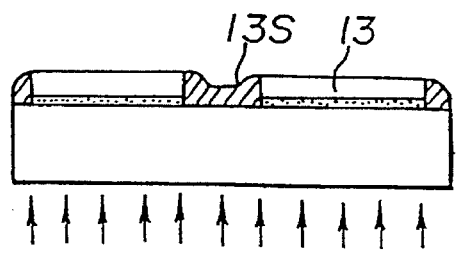
Figure 23D:
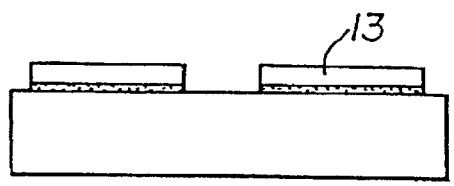
Figure 23E:
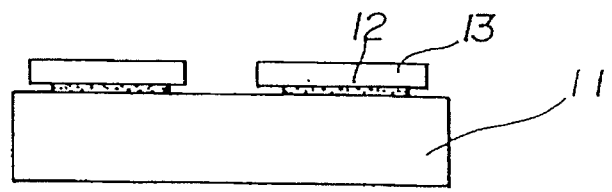
Figure 24:
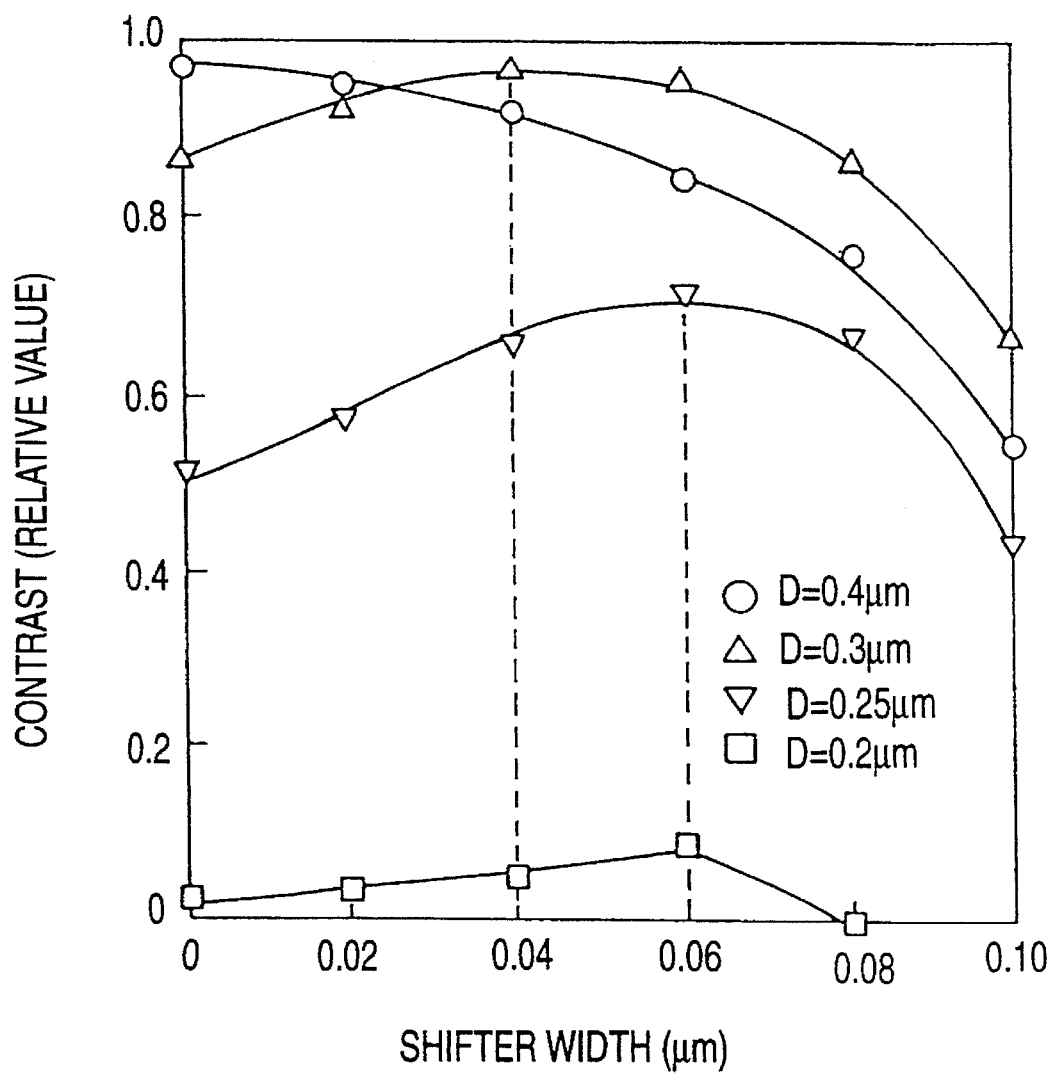
FIG. 24 shows relationship between the shifter width and contrast with respect to different pattern sizes.
Figure 25:
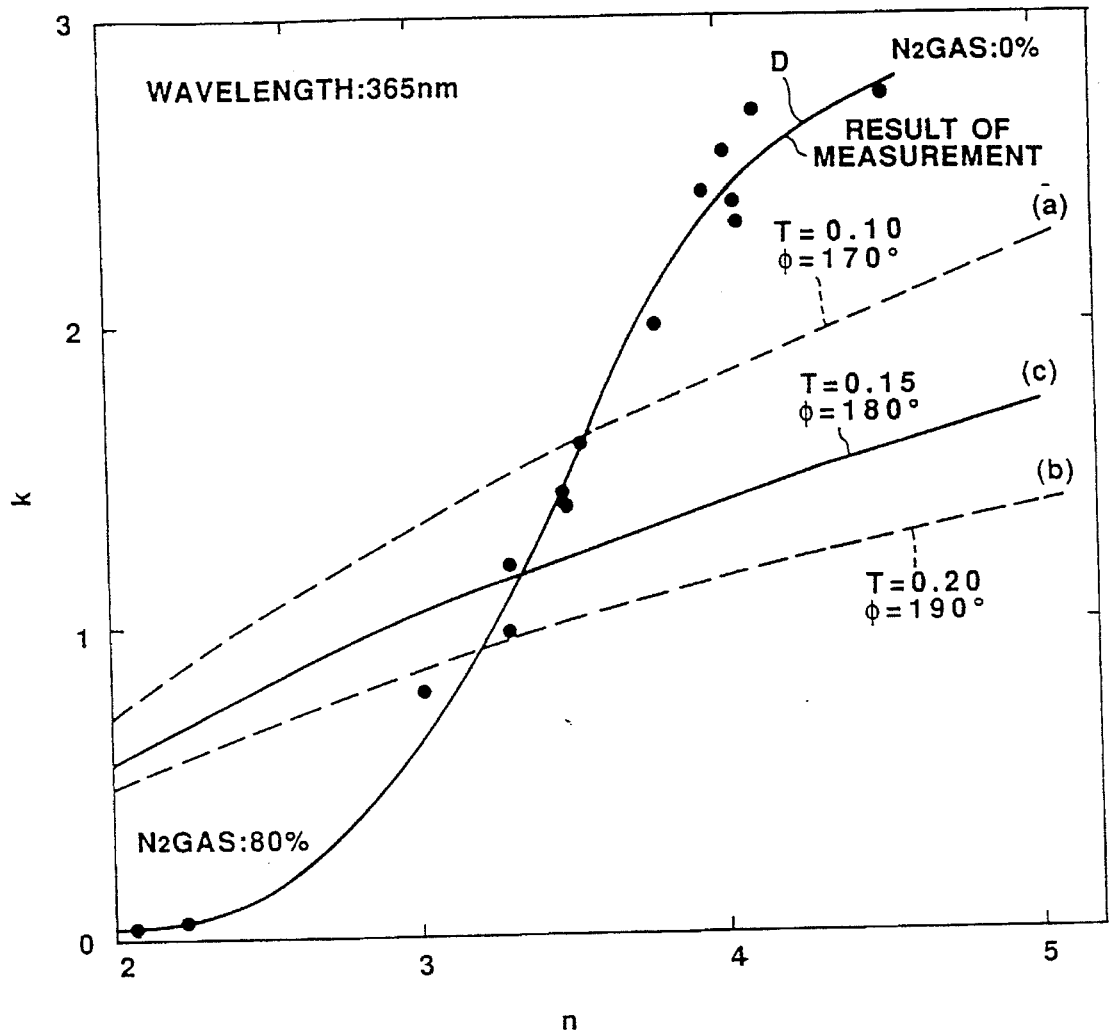
FIG. 25 shows a range of optical constant to be satisfied when a semi-transparent film pattern is made in the form of a single layer film as well as actually measured values of the optical constant (at a wavelength of 365 nm)
Figure 26:
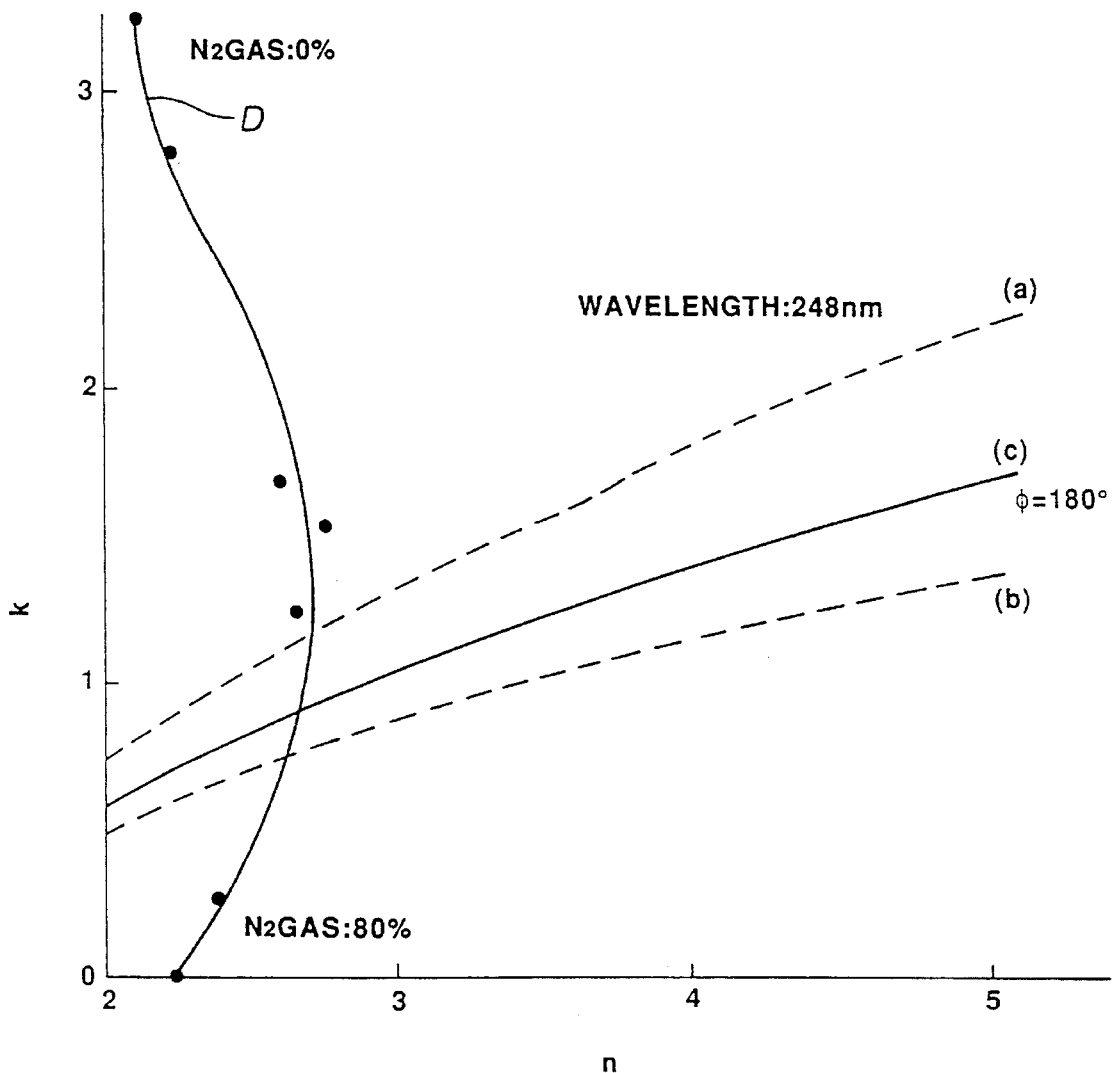
FIG. 26 shows a range of optical constant to be satisfied when a semi-transparent film pattern is made in the form of a single layer film as well as actually measured values of the optical constant (at a wavelength of 248 nm)
Figure 27:
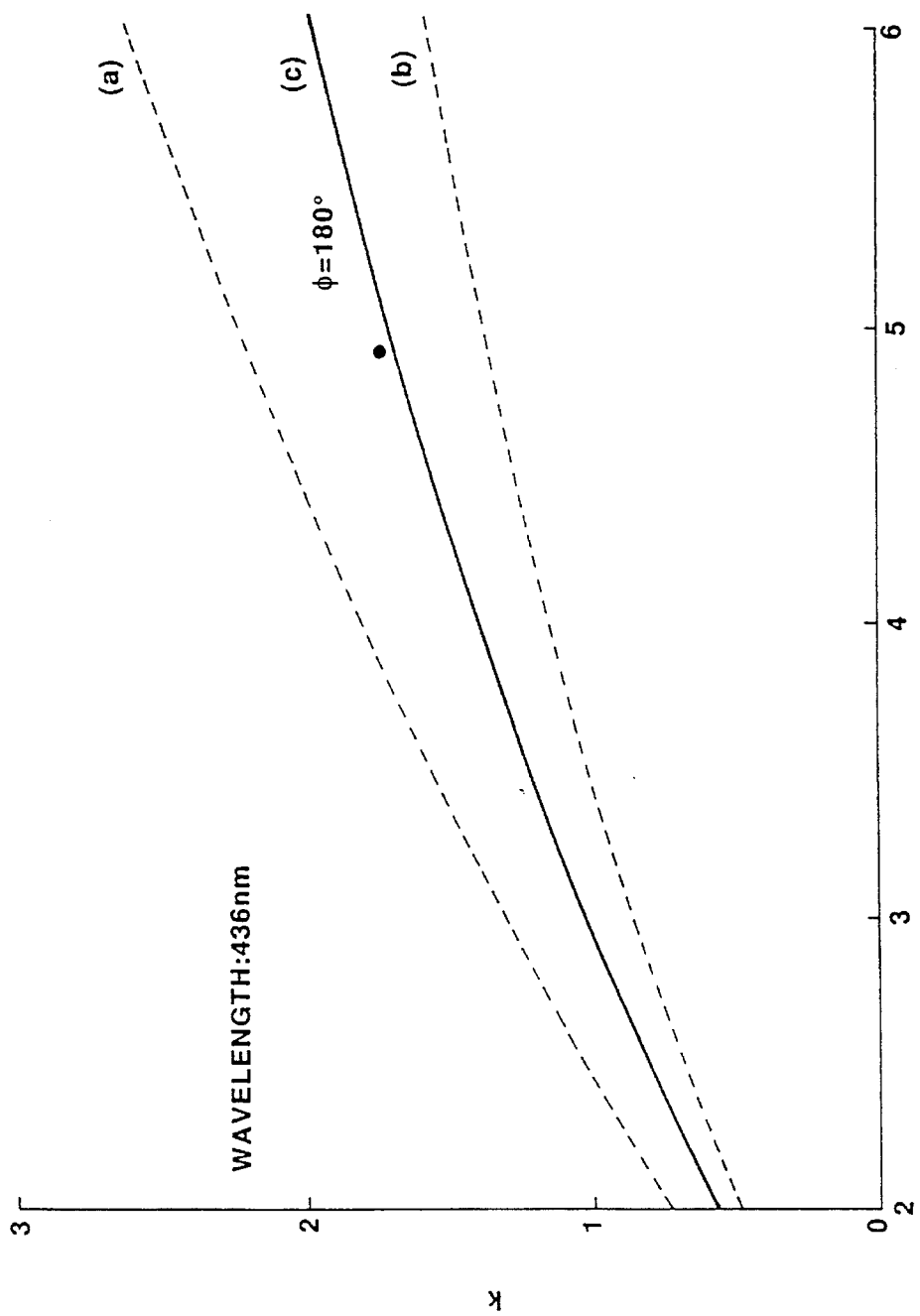
FIG. 27 shows a range of optical constant to be satisfied when a semi-transparent film pattern is made in the form of a single layer film as well as actually measured values of the optical constant (at a wavelength of 436 nm)

FIG. 18 shows variations in the contrast of the light image intensity distribution when the shifter width is fixed and the amplitude transmissivity ratio is varied in a mask pattern having a line-and-space (minimum linewidth) of 0.25 µm. FIG. 19 shows measurement results showing a relationship between the shifter amplitude transmissivity ratio and the shifter width when the contrast is maximum.

As a result of the repetitive tests, it has been found that the above phenomenon commonly takes place when the pattern size of the master pattern divided by λ/NA on the light exposure condition falls within a range of 0.34–0.68. Accordingly, by suitably adjusting the transmissivity ratio of the shifter in the respective pattern sizes within the above range, a great contrast improvement effect can be realized with the shifter widths in such a range as to provide a sufficient accuracy in the shifter processing.

Although explanation has been made in connection with the foregoing embodiments of the present invention wherein the transparent film as the phase shifter is made of a polymethyl methacrylate film as the resist or of the silicon di-oxide layer as the inorganic film, the present invention is not limited to the specific examples but any material may be used so long as the material exhibit a high transmissivity ratio with respect to the exposure light having a wavelength of 436 nm or less. For example, the inorganic film may be made of calcium fluoride (CaF), magnesium fluoride (MgF), aluminum oxide ($Al_2O_3$) or the like material. Further, the phase shifter resist may be polymethyl methacrylate, poly-trifluoroethyl-α-chloroacrylate, chloromethylation polystyrene, polydimethyl glutaric imide, polymethyl isopropenyl ketone or the like material. The thickness, etc. of the pattern may be suitably modified depending on the material and lithography light.

Furthermore, the materials of the light-transmissible substrate and light-blocking film are also not limited to the specific examples used in the foregoing embodiments, but may be suitably modified as necessary. In addition, it is not necessary that the phase shifter layer always provide a phase shift of 180 degrees, and any phase shift somewhat deviated from 180 degrees may be employed so long as the light intensity distribution of the pattern edge can be sharply reduced in the vicinity of 100 degrees.

Embodiment 9:

FIG. 28 shows steps of fabricating a reticle in accordance with a ninth embodiment of the present invention. This reticle is featured in that a silicon pattern formed by a sputtering technique is used as a semi-transparent film pattern, and this mask can be used as a reticle for g-ray projection lithography.

Figure 28A:
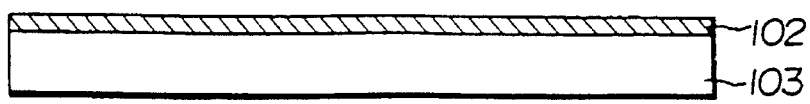
FIGS. 28(a) through 28(e) show steps of fabricating a reticle in accordance with a ninth embodiment of the present invention.

First, as shown in FIG. 28(a), a silicon di-oxide substrate 101 is subjected to a sputtering operation to form a silicon film 102 of 59 nm thick thereon. The silicon film 102 having a thickness of 59 nm has a refractive index n of 4.93 and provides a phase difference of 180 degrees with respect to the g ray of a mercury lamp. Its amplitude transmissivity ratio is 17.4% with respect to the amplitude transmissivity ratio of the silicon di-oxide substrate 101 as a transparent layer.

Figure 28B:
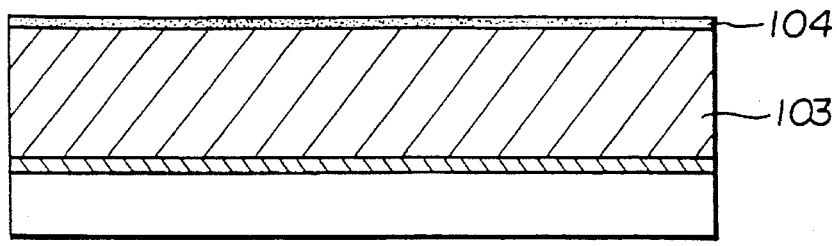

Next, as shown in FIG. 28(b), resist for electron beam is deposited on the resultant substrate in the form of a layer 103 having a thickness of 0.5 µm, and further an electrically conductive film 104 is formed thereon to have a thickness of about 0.2 µm.

Figure 28C:
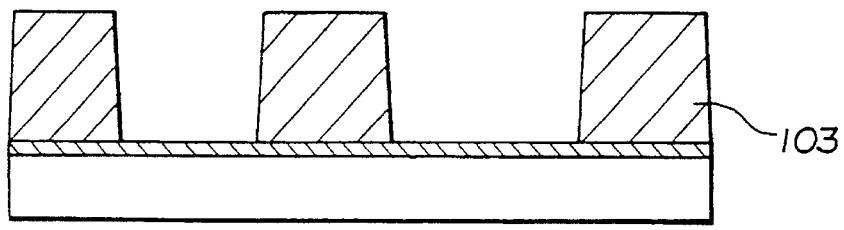

An electron beam writing is carried out onto the conductive film 104 at 3 µC/cm$^2$ and then subjected to a developing operation to form a resist pattern 103 (refer to FIG. 28(c)). The purpose of the formation of the conductive film 104 is to prevent the charging up of the electron beam when the resist is insulating material.

Figure 28D:
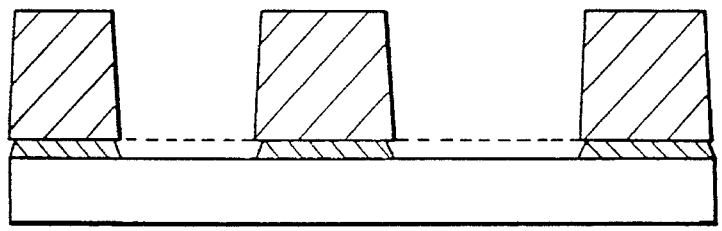

The resultant substrate is subjected to a chemical dry etching (CDE) with use of the resist pattern 103 as a mask and a mixture gas of $CF_4$ an $O_2$ to partly remove the silicon film 102 exposed to the resist pattern (refer to FIG. 28(d)).

Figure 28E:
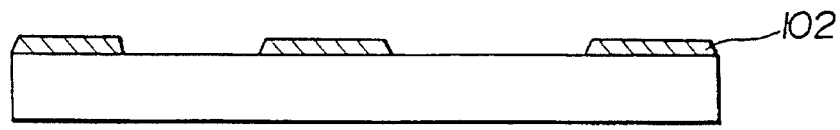

Finally, the resist pattern 103 is removed to obtain a silicon film pattern 102 (FIG. 28(e)).

In this way, a phase shifter in the form of a desired single-layer, semi-transparent film can be obtained.

Although the formation of the silicon film as the phase shifter has been carried out by means of the sputtering in the present embodiment, a CVD technique or the like method may be employed. The silicon film may be set to have a suitable thickness so long as the thickness lies in a range not departing from the subject matter of the present invention.

Further, the processing of the silicon film may be effected by means of reactive ion etching.

With use of the thus-fabricated reticle, a layer of 1.5 µm thick and of resist PER7750 (manufactured by Nippon Gousei Gomu K.K.) coated on a substrate is subjected to a ⅕ reduction lithography with use of g ray (NA=0.54, σ=0.5). At this time, the quantity of lithographic light is 300 mJ/cm$^2$. When the mask of the present invention is used, a 0.45 µm pattern can be resolved with a focus margin of 0.7 µm, though the same pattern is resolved with a focus margin of 0 µm in the conventional mask.

With respect to a contact hole pattern, a 0.50 µm pattern is confirmed to be resolved with a focus margin of 1.5 µm in the present invention, though the same pattern is not resolved in the conventional masks. Further, when processing of a substrate is carried out with use of the resist pattern transferred and formed using the above mask, a better processed shape can be obtained.

Embodiment 10:

Detailed explanation will be directed to a tenth embodiment of the present invention. A reticle according to the present embodiment is featured in that a Ge pattern formed by a sputtering method is used as a semi-transparent film pattern, and can be used as a projection reticle for g ray.

In this example, a Ge film 102 of 70 nm thick is formed on a silicon di-oxide substrate by a sputtering method. When the Ge film of 7.03 nm thick is used to have a refractive index n of 4.1 and provide a phase difference of 180 degrees with respect to the g ray of a mercury lamp, an amplitude transmissivity ratio is 10.8% with respect to the amplitude transmissivity ratio of the silicon di-oxide substrate 101.

As in the embodiment 9, resist for electron beam is deposited on the resultant substrate in the form of a layer having a thickness of 0.5 μm and further an electrically conductive film having a thickness of about 0.2 μm is formed thereon.

An electron beam writing is carried out on the conductive film at 3 μC/cm$^2$ and then developing operation is effected to form a resist pattern.

The resultant substrate is subjected to a chemical dry etching (CDE) process with use of the pattern as a mask and a $Cl_2$ gas to remove the Ge film exposed from the resist pattern. Finally, the resist pattern is removed to obtain a Ge film pattern. In this way, a phase shifter in the form of a desired single-layer semi-transparent film can be obtained.

The formation of the Ge film as the phase shifter has been carried out by means of sputtering in the present embodiment, but a deposition method or the like may be employed. Further, the film thickness may be set to have a suitable value so long as the thickness lies in a range not departing from the subject matter of the present invention.

Also, the processing of the Ge film may be effected by means of reactive ion etching with use of such a gas containing fluorine as $CF_4$ or $C_2F_6$.

With use of the thus-formed reticle, a layer of 1.5 μm thick and of resist PER7750 (manufactured by Nippon Gousei Gomu K. K.) coated on a substrate is subjected to a ⅕ reduction lithography with use of g ray (NA=0.54, σ=0.5). At this time, the quantity of lithographic light is 300 mJ/cm$^2$. When the mask of the present invention is used, a 0.45 μm pattern can be resolved with a focus margin of 0.7 μm, though the same pattern is resolved with a focus margin of 0 μm in the conventional mask.

With respect to a contact hole pattern, a 0.50 μm pattern is confirmed to be resolved with a focus margin of 1.5 μm in the present invention, though the same pattern is not resolved in the conventional mask.

Embodiment 11:

Detailed explanation will be directed to an eleventh embodiment of the present invention. A reticle according to the present embodiment is featured in that an SiN pattern formed by a sputtering method is used as a semi-transparent film pattern, and can be used as a projection reticle for i ray.

In this example, an SiN film of 446 nm thick is formed on a silicon di-oxide substrate with use of silicon nitride which nitrogen amount is adjusted as a target by a sputtering method. When the SiN film is used to have a refractive index n of 2.23 with respect to the i ray of a mercury lamp, an amplitude transmissivity ratio is 20.1% with respect to the amplitude transmissivity ratio of the silicon di-oxide substrate.

As in the embodiments 1 and 2, resist for electron beam is deposited on the resultant substrate in the form of a layer having a thickness of 0.5 μm and further an electrically conductive film having a thickness of about 0.2 μm is formed thereon. The electron beam writing is carried out on the conductive film at 3 μC/cm$^2$ which is then developed to form a resist pattern.

The resultant substrate is subjected to a chemical dry etching (CDE) process with use of the pattern as a mask and a $CF_4$ gas to remove the SiN film exposed from the resist pattern. Finally, the resist pattern is removed to obtain an SiN film pattern. In this way, a phase shifter in the form of a desired single-layer semi-transparent film can be obtained.

The formation of the SiN film as the phase shifter has been carried out by means of sputtering in the present embodiment, but a deposition method or the like may be employed. Further, the film thickness may be set to have a suitable value so long as the thickness lies in a range not departing from the subject matter of the present invention.

With use of the thus-formed reticle, a layer of 1.5 μm thick and of resist PER7750 (manufactured by Nippon Gousei Gomu K. K.) coated on a substrate is subjected to a ⅕ reduction lithography with use of i ray (NA=0.5, σ0.5). At this time, the quantity of lithographic light is 300 mJ/cm$^2$. When the mask of the present invention is used, a 0.35 μm pattern can be resolved with a focus margin of 0.8 μm, though the same pattern is resolved with a focus margin of 0 μm in the conventional mask.

With respect to a contact hole pattern, it is confirmed that a 0.40 μm pattern is resolved with a focus margin of 1.3 μm in the present invention, though the same pattern is not resolved in the conventional mask.

Embodiment 12:

Detailed explanation will be directed to a twelfth embodiment of the present invention. A reticle according to the present embodiment is featured in that an SiN pattern formed by a sputtering method is used as a semi-transparent film pattern, and can be used as a mask for KrF (248 nm).

In this example, an SiN film of 76 nm thick is formed on a silicon di-oxide substrate with use of silicon as a target while adding a predetermined amount of nitrogen gas thereto by a sputtering method. When the SiN film is used to have a refractive index n of 2.68 with respect to KrF, an amplitude transmissivity ratio is 15% with respect to the amplitude transmissivity ratio of the silicon di-oxide substrate.

As in the embodiments 9 and 11, resist for electron beam is deposited on the resultant substrate in the form of a layer having a thickness of 1.5 μm and further an electrically conductive film having a thickness of about 0.2 μm is formed thereon. The electron beam writing is carried out on the conductive film at 6 μC/cm$^2$ which is then developed to form a resist pattern.

The resultant substrate is subjected to a chemical dry etching (CDE) process with use of the pattern as a mask and $CF_4$ and $O_2$ gases to remove the SiN film exposed from the resist pattern. Finally, the resist pattern is removed to obtain an SiN film pattern. In this way, a phase shifter in the form of a desired single-layer semi-transparent film can be obtained.

The formation of the SiN film as the phase shifter has been carried out by means of sputtering in the present embodiment, but a CVD method with use of ammonium and a gas containing silane or the like method may be employed. Further, the film thickness may be set to have a suitable value so long as the thickness lies in a range not departing from the subject matter of the present invention.

With use of the thus-formed reticle, a layer of 1.0 μm thick and of KrF resist XP8843 (manufactured by Shipule company) coated on a substrate is subjected to a ⅕ reduction lithography with use of a KrF excimer laser beam (NA=0.4, σ=0.5) for patterning. At this time, the quantity of lithographic light is 40 mJ/cm². When the mask of the present invention is used, a 0.30 μm pattern can be resolved with a focus margin of 0.7 μm, though the same pattern is resolved with a focus margin of 0 μm in the conventional mask.

With respect to a contact hole pattern, it is confirmed that a 0.30 μm pattern is resolved with a focus margin of 1.2 μm in the present invention, though the same pattern is not resolved in the conventional mask.

Embodiment 13:

FIG. 29 shows steps of fabricating a reticle in accordance with a thirteenth embodiment of the present invention. This reticle is featured in that a silicon nitride pattern formed as controlled in its nitrogen composition ratio by a sputtering technique is used as a semi-transparent film pattern, and this mask can be used as a mask for i-ray projection lithography.

Figure 29A:
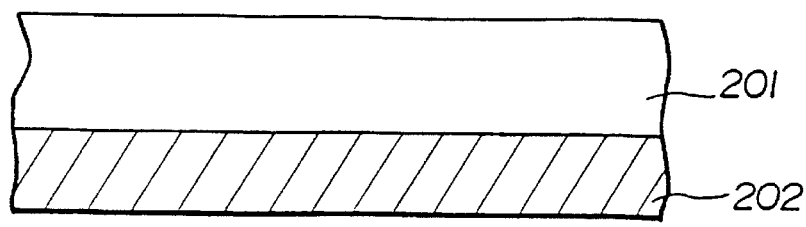
FIG. 29 shows steps of fabricating a reticle in accordance with a tenth embodiment of the present invention.

First, as shown in FIG. 29(a), a molten crystal substrate of, e.g., 2.4 mm thick and of a square shape each having a side length of 5 inches is used as a light-transmissible substrate, and the substrate is subjected thereon to a sputtering process with use of silicon as a target in an atmosphere of a mixture gas of nitrogen and argon (15% of nitrogen content) to form a silicon nitride film 202 of 80 nm thick. When the silicon nitride film 202 has a refractive index n of 3.4 with respect to the i ray of the mercury lamp, an amplitude transmissivity ratio of the semi-transparent film to the molten crystal substrate 201 as a transparent layer is 15%.

Figure 29B:
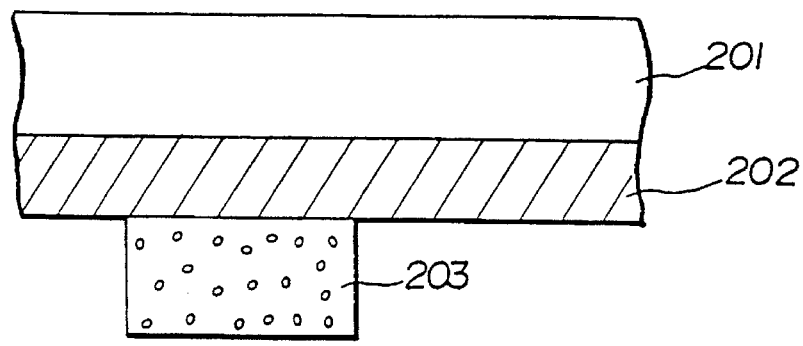

Next, as shown in FIG. 29(b), resist is coated on the resultant substrate in the form of a resist layer 203 having a thickness of 0.5 μm, and further subjected to an EB lithography process to form thereon a desired resist pattern.

Figure 29C:
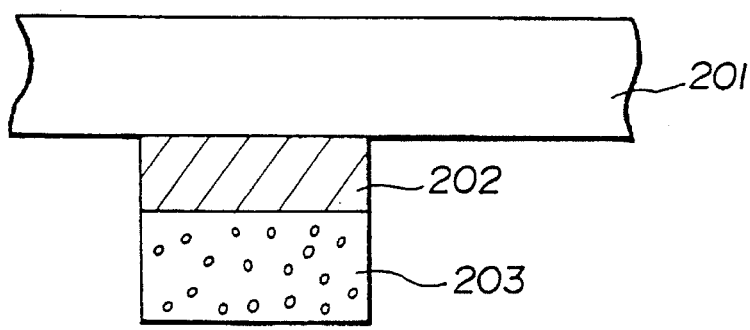

Thereafter, the resultant substrate is subjected to a chemical dry etching (CDE) process with use of the resist pattern 203 as a mask and a mixture gas of $CF_4$ and $O_2$ to remove the silicon nitride film 202 exposed from the resist pattern (refer to FIG. 29(c)).

Figure 29D:
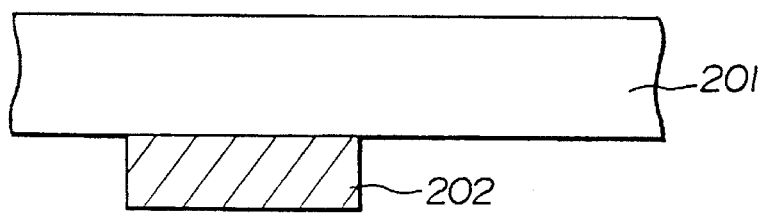
Figure 30:
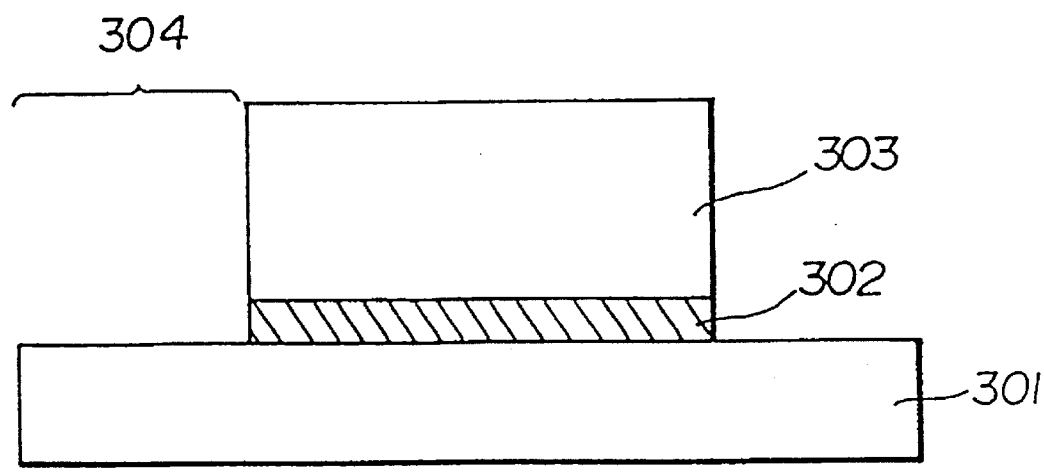
FIG. 30 shows a conventional phase shifter.
Figure 31:
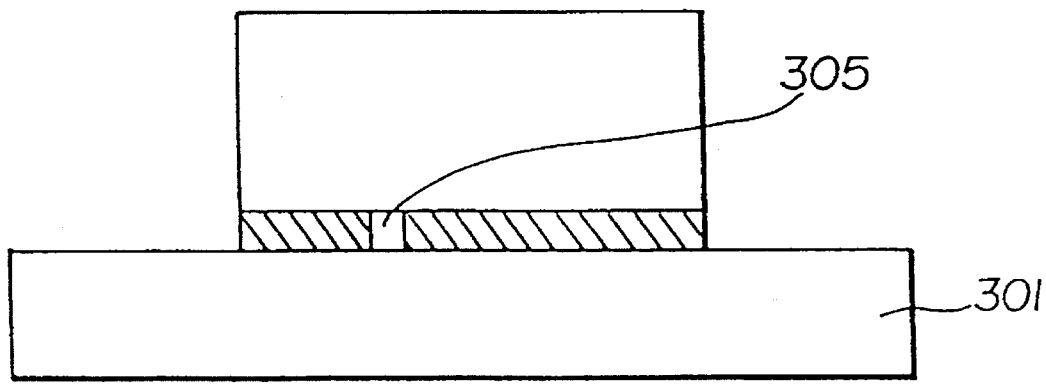
FIG. 31 shows a conventional phase shifter having a defect therein.

The resultant substrate is immersed into a mixture solution of sulfuric acid and hydrogen peroxide to remove the resist pattern 202 and to obtain a silicon nitride film pattern 202 (refer to FIG. 29(d)).

In this way, a phase shifter made of a desired single-layer semi-transparent film can be obtained.

Although the formation of the silicon nitride film as the phase shifter has been carried out by means of the sputtering with use of silicon as the target and while controlling the quantity of nitrogen gas in the present embodiment, a sputtering process with use of a mosaic target of silicon and silicon nitride or a CVD technique for controlling a gas ratio may be employed. Further, the film thickness may be set to have a suitable value which lies in a range not departing the subject matter of the present invention.

In addition, the fine adjustment of the refractive index and amplitude transmissivity ratio may be carried out by means of ion implantation and/or heat treatment for surface modification.

Algorithm for calculating optical constants of the semi-transparent film will now be described.

Figure 32:
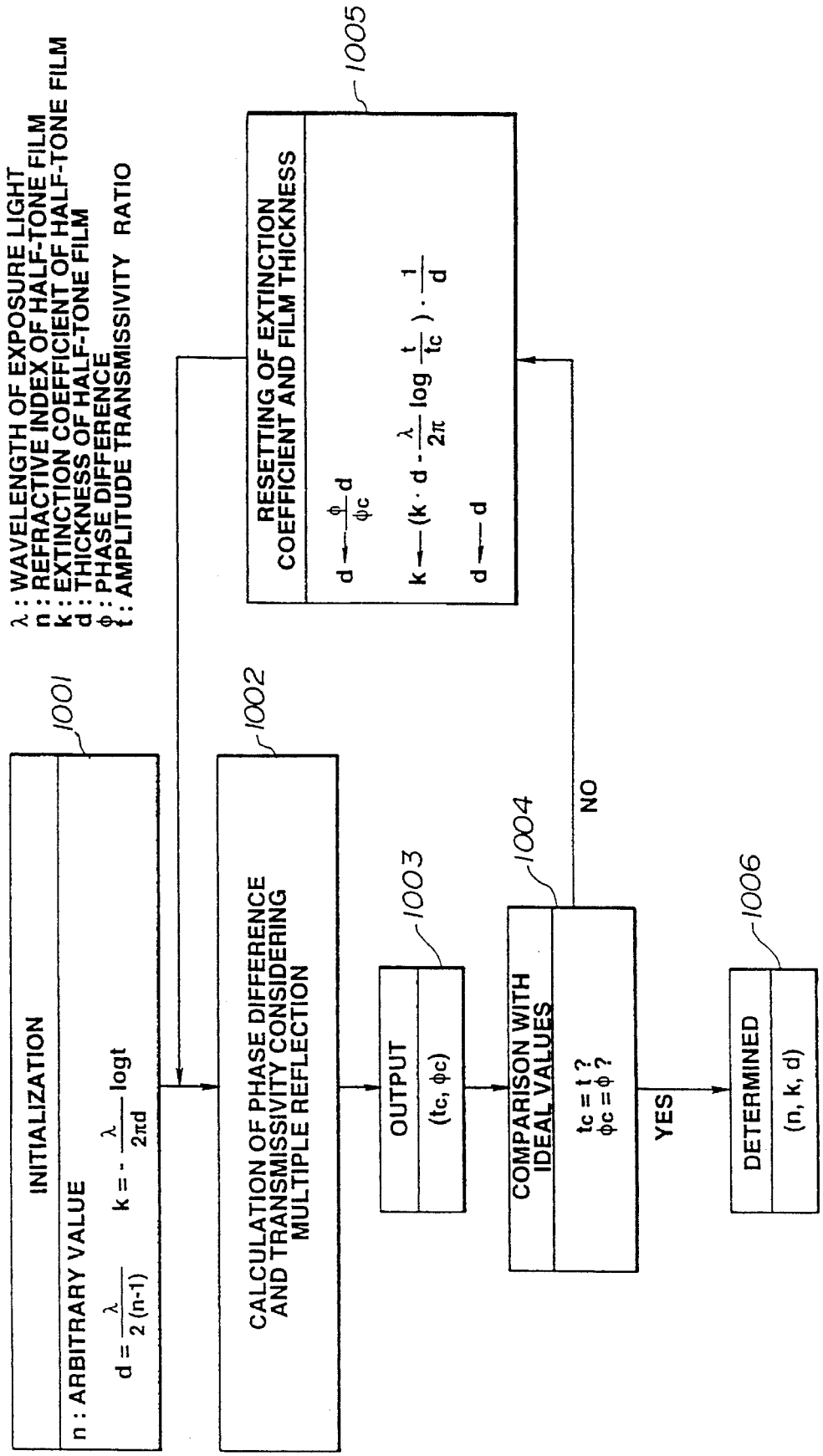
FIG. 32 shows an algorithm for calculating optical constants of a semi-transparent film in which refractive index is an arbitrary value.

Referring to FIG. 32, initial values for two of the refractive index, extinction coefficient and film thickness of the semi-transparent film are set with respect to wavelength of an exposure light beam while an initial value of the remaining one of the refractive index, extinction coefficient and film thickness is an arbitrary value.

It is assumed that the refractive index is an arbitrary value and the initial values of the extinction coefficient k and the film thickness d are to be set.

The initial values of the extinction coefficient k and the film thickness d are determined such as to satisfy the following equations (step 1001).

For example, $$d=\lambda/(2(n-1)), \quad k=-(\lambda/2\pi d)\log t$$

where λ:

wavelength of exposure light n: refractive index of half-tone film at wavelength λ k: extinction coefficient of half-tone film at wavelength λ

φ: phase difference t: amplitude transmissivity ratio

Then, the phase difference φ and transmissivity ratio t are calculated while considering multiple reflection (step 1002) and the results of the calculation are represented by the phase difference $\phi_c$ and the transmissivity ratio respectively (step 1003).

These calculated values are compared with ideal values (step 1004), and it is determined whether errors between the calculated value and the ideal values are within allowable ranges.

When the errors are outside of the allowable ranges, the extinction coefficient k and film thickness d are reset (step 1005) and the operation goes back to step 1002 where the phase difference φ and transmissivity ratio t are calculated while considering multiple reflection. Then, a loop of steps 1005, 1002, 1003 and 1004 are repeated.

When the errors are within the allowable ranges, the calculated values of the extinction coefficient k and the film thickness t are determined as ideal values thereof (step 1006).

Thus, the optical constants of a half-tone film having ideal transmissivity ratio and phase difference can be easily determined.

The values satisfying the above equations are not necessarily used as the initial values of the extinction coefficient k and the film thickness d. However, by using these values, the convergence of the repeated operation in the loop will be faster.

Further, the loop (step 1005) is not necessarily that in FIG. 32. Any equations may be used as long as they feed back the difference between the calculated values and the ideal values.

Figure 33:
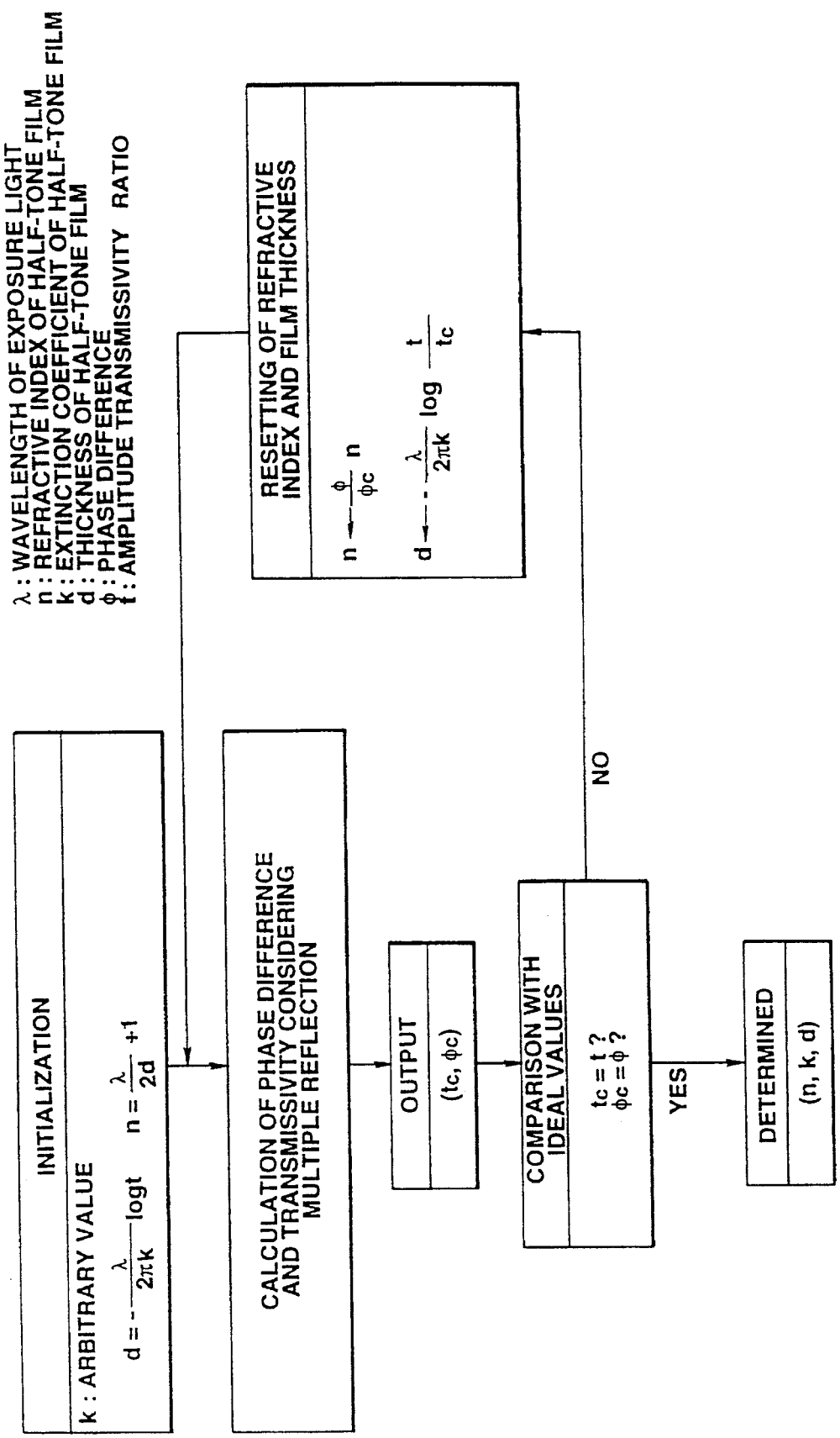
FIG. 33 shows an algorithm for calculating optical constants of a semi-transparent film in which extinction coefficient is an arbitrary value.
Figure 34:
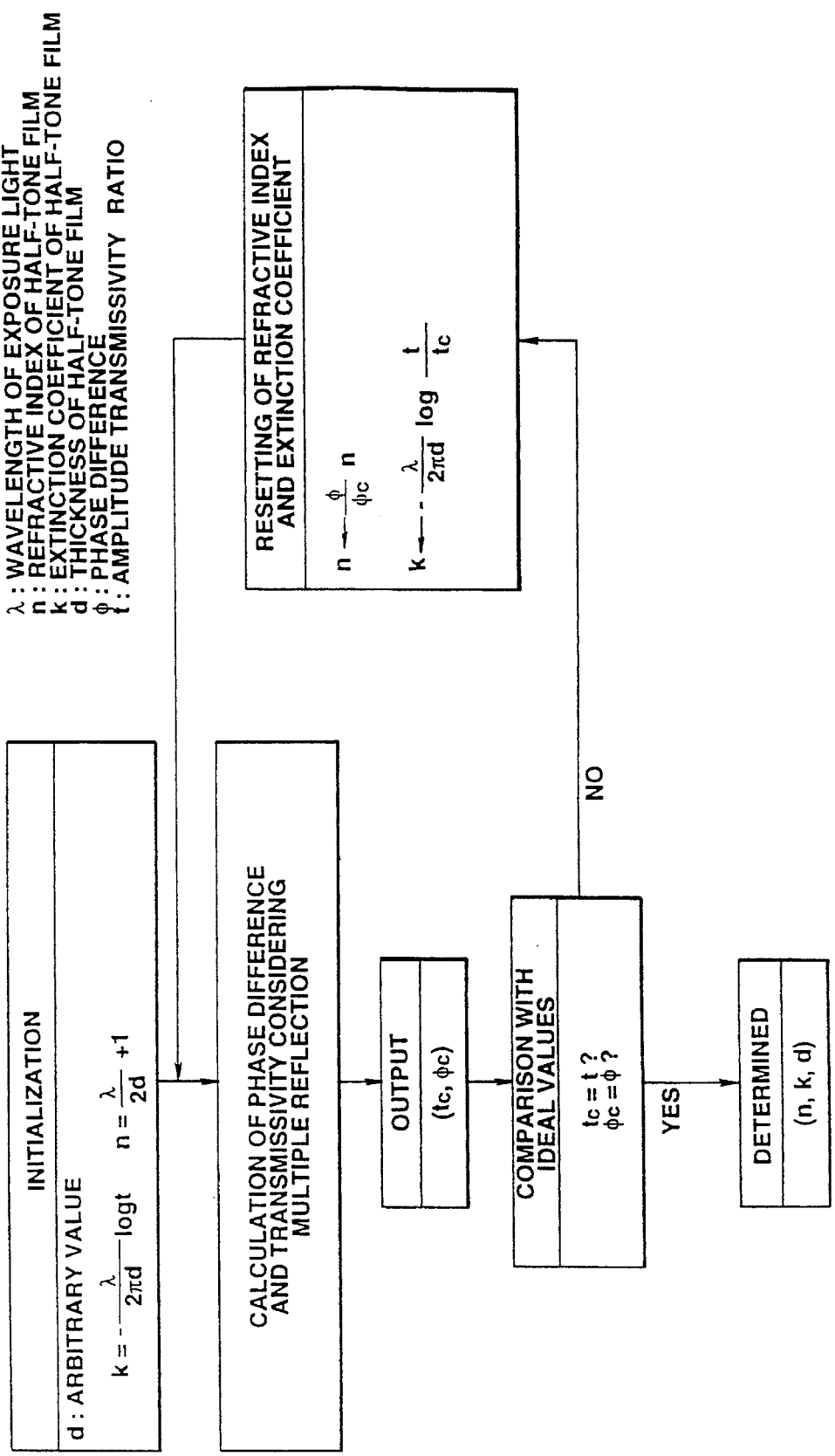
FIG. 34 shows an algorithm for calculating optical constants of a semi-transparent film in which film thickness is an arbitrary value.

FIG. 33 shows an algorithm in which the extinction coefficient is an arbitrary value and FIG. 34 shows an algorithm in which the film thickness is an arbitrary value.

As has been disclosed in the foregoing, in accordance with the reticle of the present invention, the light blocking film pattern can be replaced by the semi-transparent film pattern, so that the contrast can be improved and the resolution can be enhanced.

Since the reticle in accordance with the second embodiment of the present invention is of a stacked layer structure which comprises the phase shift film for providing a different optical path to the exposure light, the semi-transparent film as the transmissivity ratio adjustment layer formed on the top or bottom of the phase shift film and having a predetermined transmissivity ratio to the exposure light, the film for shifting the phase of the light and the film for adjusting the transmissivity ratio can be selected independently of each other and thus the reticle high in strength against its cleaning operations.

In accordance with the third embodiment of the present invention, the amplitude transmissivity ratio of the material of the phase shifter is adjusted so that the shifter width for effectively improving the contrast can be made large and the accuracy necessary for the shifter width can be loosened, whereby the mask having a high accuracy and a high contrast can be easily fabricated.

In this way, in accordance with the reticle of the present invention, the faithful pattern having a high accuracy can be fabricated without the dependency of the pattern density.

Further, in accordance with the present invention, since the reticle can be made in the form of a single-layer film having an optimum optical constant, there can be realized a reticle which is high in reliability and easy in the control of the amplitude transmissivity ratio and phase difference.

What is claimed is:

1. A method of exposing light comprising the steps of:

forming a mask pattern made of a mask film pattern formed on a light-transmissible substrate, the mask pattern being a semi-transparent film which causes a length of an optical path for a light beam passing therethrough to be different from a length of an optical path for a light beam passing through the substrate by a predetermined amount, the step of forming a mask pattern comprising the steps of:

determining ranges of refractive index n and extinction coefficient k of the semi-transparent film within which an amplitude transmissivity ratio T and a phase difference $\phi$ between the semi-transparent film and air that has the same thickness of the semi-transparent film fall within ranges necessary to obtain desired resolution and depth of focus, obtaining relationship in the form of a curved line between the refractive index n and the extinction coefficient k by changing conditions for formation of the mask pattern, selecting values of the refractive index and the extinction coefficient k from the ranges thus determined, and determining the conditions for formation of the mask pattern such that the refractive index n and the extinction coefficient k become the selected values, and forming a mask film pattern based on the conditions for formation of the mask pattern; and irradiating an exposure beam onto a resist through a reticle using the mask pattern.

2. A method of exposing light as set forth in claim 1, wherein the step of forming the mask film pattern comprises the step of forming a silicon nitride or silicon oxide film having desired values of amplitude transmissivity ratio and phase difference by mixing a predetermined quantity of nitrogen or oxygen gas in a sputtering atmosphere using silicon as a target and controlling a nitrogen or oxygen composition ratio based on the conditions for formation of the mask pattern.

3. A method of exposing light as set forth in claim 2, wherein said phase difference is substantially $\pi$.

4. A method of exposing light as set forth in claim 1, wherein said exposure beam is a g ray and the step of forming the mask film pattern comprises the step of forming a mask pattern made of amorphous silicon based on the conditions for formation of the mask pattern, thereby forming a mask pattern having desired values of amplitude transmissivity ratio and phase difference.

5. A method of exposing light as set forth in claim 4, wherein, said phase difference is substantially $\pi$.

6. A method of exposing light as set forth in claim 4, wherein the step of forming the mask film pattern comprises the step of forming a silicon nitride or silicon oxide film having desired values of amplitude transmissivity ratio and phase difference by mixing a predetermined quantity of nitrogen or oxygen gas in a sputtering atmosphere using silicon as a target and controlling a nitrogen or oxygen composition ratio based on the conditions for formation of the mask pattern.

7. A method of exposing light as set forth in claim 1, wherein said exposure beam is an i ray.

8. A method of exposing light as set forth in claim 1, wherein said exposure beam is an g ray.

9. A method of exposing light as set forth in claim 1, wherein the step of forming the mask film pattern comprises the step of depositing a silicon dioxide film while adjusting the quantity of oxygen in a raw material gas by using a CVD technique based on the conditions for formation of the mask pattern so as to control an oxygen composition ratio in the silicon dioxide film, thereby forming a mask pattern having desired values of amplitude transmissivity ratio and phase difference.

10. A method of exposing light as set forth in claim 1, wherein the step of forming the mask film pattern comprises the step of depositing a silicon nitride film while adjusting the quantity of ammonium in a raw material gas by a CVD technique based on the conditions for formation of the mask pattern so as to control a nitrogen composition ratio, thereby forming a mask pattern having desired values of the amplitude transmissivity ratio and the phase difference.

* * * * *